(12) United States Patent
Wei et al.

(10) Patent No.: US 12,336,175 B2
(45) Date of Patent: Jun. 17, 2025

(54) MEMORY DEVICE AND METHOD OF MANUFACTURING THE SAME

(71) Applicant: Winbond Electronics Corp., Taichung (TW)

(72) Inventors: Cheng-Hong Wei, Taichung (TW); Chien-Hsiang Yu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 489 days.

(21) Appl. No.: 17/721,376

(22) Filed: Apr. 15, 2022

(65) Prior Publication Data

US 2023/0337424 A1    Oct. 19, 2023

(51) Int. Cl.
*H10B 41/30* (2023.01)
*H10B 41/10* (2023.01)

(52) U.S. Cl.
CPC ............ *H10B 41/30* (2023.02); *H10B 41/10* (2023.02)

(58) Field of Classification Search
CPC ......... H01L 29/42324; H01L 29/40114; H01L 29/42336; H01L 21/76829; H01L 21/0274; H01L 21/76837; H01L 21/76897; H01L 23/544; H01L 23/5222; H01L 29/7827; H01L 23/53295; H01L 21/7682; H01L 23/5329; H01L 23/528; H01L 29/4236; H01L 21/76895; H01L 21/02532; H01L 21/30604; H01L 21/02694; H01L 29/401; H01L 21/28518; H01L 29/6656; H01L 29/66636; H01L 21/283; H01L 21/76831; H01L 21/76816; H01L 29/456; H01L 21/02425; H01L 21/28525;
(Continued)

(56) References Cited

U.S. PATENT DOCUMENTS 6,104,052 A * 8/2000 Ozaki .................... H10B 12/09
257/306
6,215,144 B1 * 4/2001 Saito ................. H01L 21/76843
257/305
(Continued)

FOREIGN PATENT DOCUMENTS

JP    2009231565    10/2009
JP    2010027966    2/2010
(Continued)

OTHER PUBLICATIONS

"Office Action of Taiwan Counterpart Application", issued on Oct. 14, 2022, p. 1-p. 5.

*Primary Examiner* — Mouloucoulaye Inoussa
(74) *Attorney, Agent, or Firm* — JCIPRNET

(57) ABSTRACT

A memory device including a substrate, a plurality of stack structures, and a protective layer is provided. The plurality of stack structures are arranged along a first direction on an array area of the substrate, and each of the stack structures extends along a second direction different from the first direction. In a cross-sectional view of the memory device, each of the stack structures includes, in sequence from the substrate, a charge storage structure, a control gate, and a cap layer. The cap layer has a multilayer structure. The protective layer covers sidewalls of the stack structures. A width in the first direction of the charge storage structure, a width of the control gate, and a width of the cap layer are substantially equal to each other.

18 Claims, 27 Drawing Sheets

(58) Field of Classification Search
CPC ....... H01L 21/76855; H01L 21/823456; H01L 21/82385; H01L 21/76843; H01L 21/823418; H01L 21/82381; H01L 2223/54426; H01L 2924/0002; H10B 41/30; H10B 41/10; H10B 41/40; H10B 12/053; H10B 12/09; H10B 12/50; H10B 12/02; H10B 12/315; H10B 12/482; H10B 12/485; H10B 12/0335; H10B 12/34
See application file for complete search history.

(56) References Cited

U.S. PATENT DOCUMENTS

| | | | |
|---|---|---|---|
| 6,479,343 B1 * | 11/2002 | Hwang | H01L 28/82 257/E21.59 |
| 7,557,401 B2 | 7/2009 | Yonehama et al. | |
| 7,799,637 B2 | 9/2010 | Mokhlesi | |
| 10,714,478 B2 * | 7/2020 | Ryu | H10B 12/053 |
| 2002/0008324 A1 * | 1/2002 | Shinkawata | H10B 12/34 257/E21.507 |
| 2002/0171112 A1 * | 11/2002 | Shimizu | H10B 41/41 257/E27.103 |
| 2003/0151069 A1 * | 8/2003 | Sugimae | H10B 41/30 257/E21.691 |
| 2004/0079985 A1 | 4/2004 | Yonehama et al. | |
| 2005/0036353 A1 * | 2/2005 | Sugimae | H10B 41/30 365/123 |
| 2006/0189051 A1 * | 8/2006 | Kim | H01L 21/76832 257/E21.507 |
| 2007/0187749 A1 * | 8/2007 | Sugimae | H10B 69/00 257/E21.691 |
| 2007/0281416 A1 * | 12/2007 | Baars | H10B 12/50 438/238 |
| 2011/0049636 A1 * | 3/2011 | Ooike | H10B 41/40 257/E27.06 |
| 2012/0001272 A1 * | 1/2012 | Jang | H10B 12/50 257/E27.06 |
| 2012/0156855 A1 * | 6/2012 | Sim | H01L 21/764 438/421 |
| 2013/0037871 A1 * | 2/2013 | Sudo | H01L 21/76232 257/295 |
| 2013/0214415 A1 | 8/2013 | Pachamuthu et al. | |
| 2016/0211215 A1 * | 7/2016 | Lee | H01L 23/5222 |
| 2017/0069726 A1 * | 3/2017 | Kye | H01L 21/7682 |
| 2018/0151581 A1 * | 5/2018 | Wu | H10B 41/35 |
| 2019/0165115 A1 * | 5/2019 | Lin | H01L 29/42368 |
| 2020/0105777 A1 * | 4/2020 | Lin | H01L 21/3212 |
| 2020/0227315 A1 * | 7/2020 | Park | H01L 21/0274 |
| 2020/0312852 A1 * | 10/2020 | Ryu | H10B 12/053 |
| 2020/0343256 A1 * | 10/2020 | Tsai | H01L 29/6659 |
| 2021/0151447 A1 * | 5/2021 | Chuang | H01L 29/66969 |
| 2021/0375899 A1 * | 12/2021 | Lin | H10B 41/49 |
| 2021/0376120 A1 * | 12/2021 | Chen | H10B 41/30 |

FOREIGN PATENT DOCUMENTS

| | | |
|---|---|---|
| TW | 201214630 | 4/2012 |
| TW | I442516 | 6/2014 |

* cited by examiner

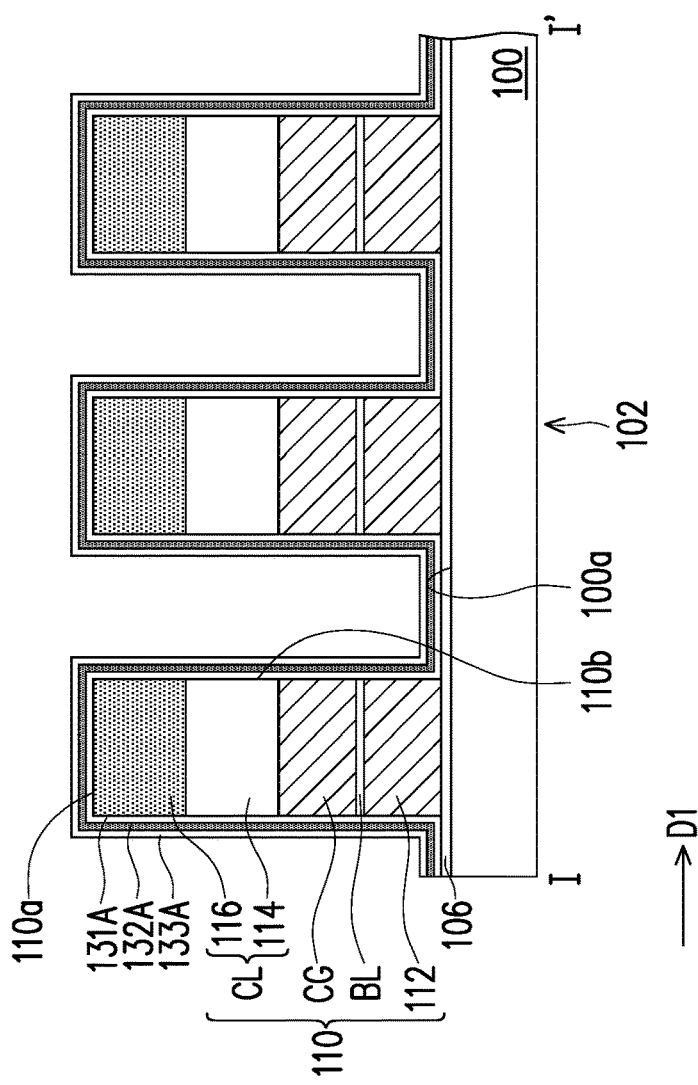
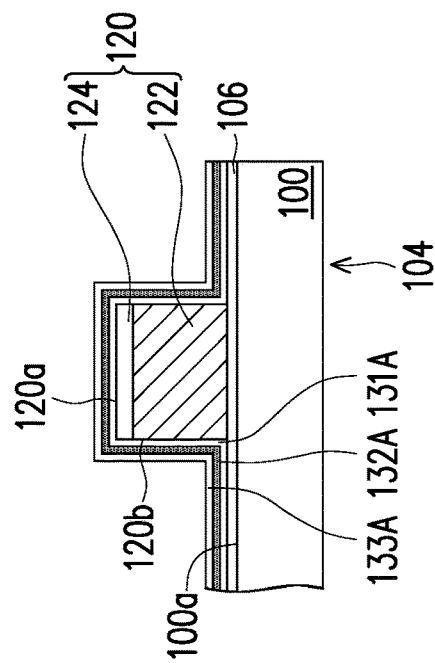
FIG. 2A
FIG. 2B

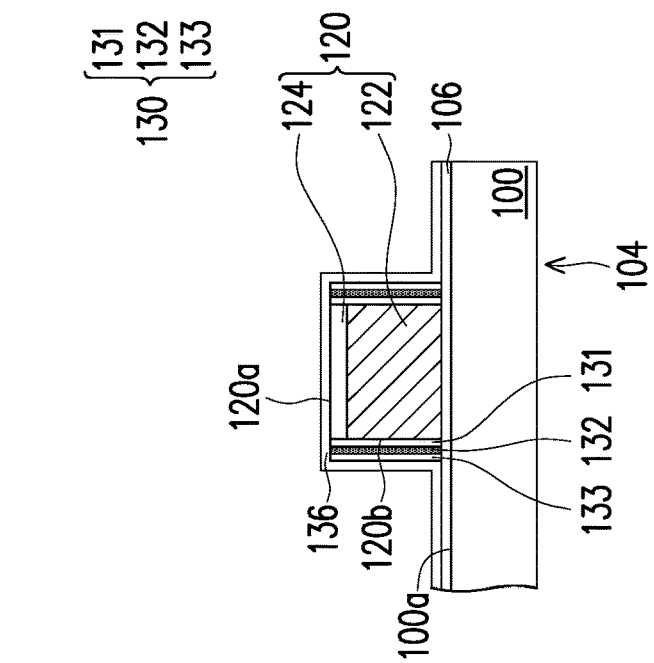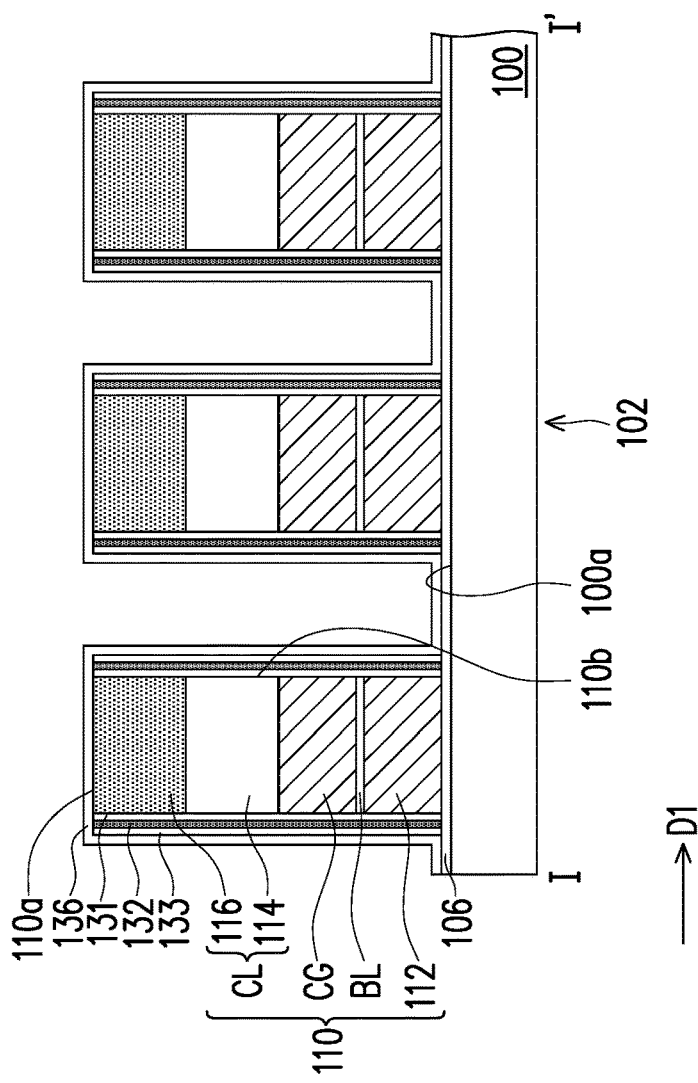
FIG. 4A
FIG. 4B

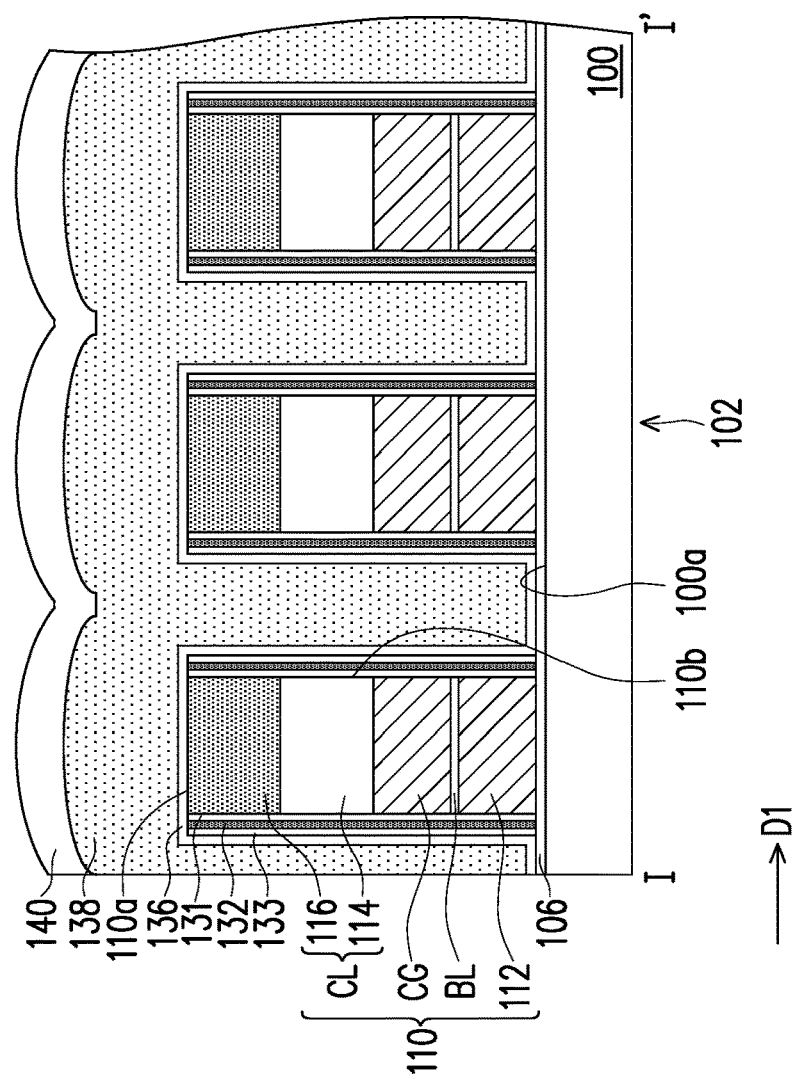
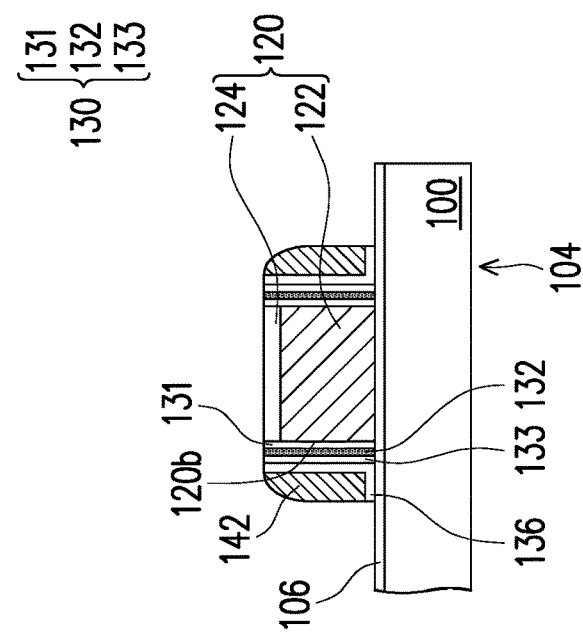
FIG. 6A
FIG. 6B

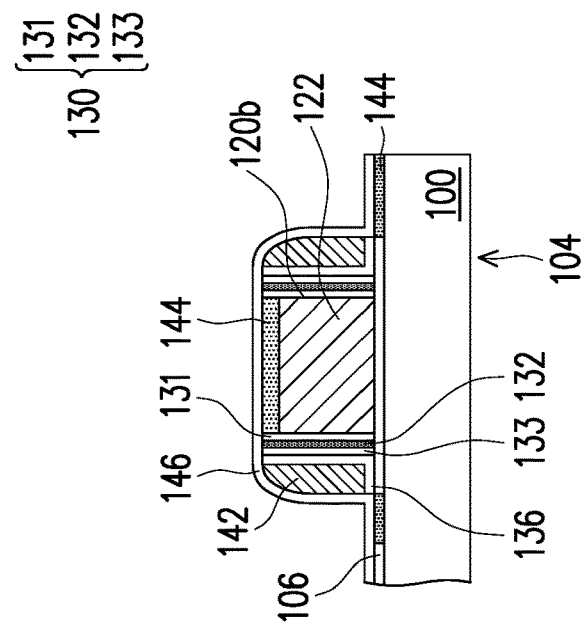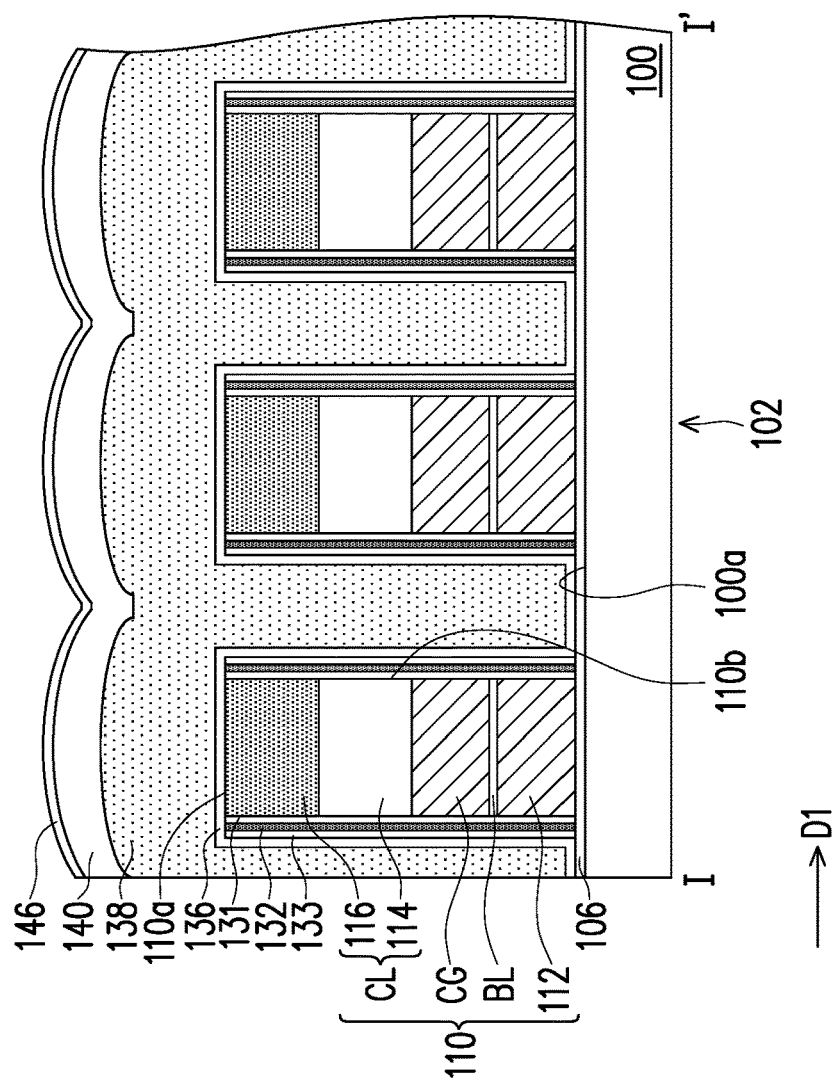
FIG. 7A
FIG. 7B

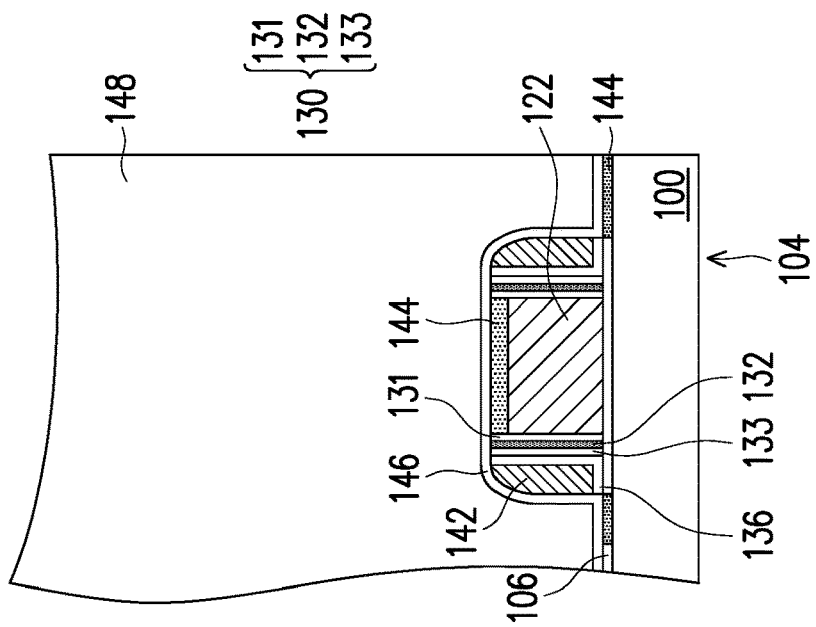
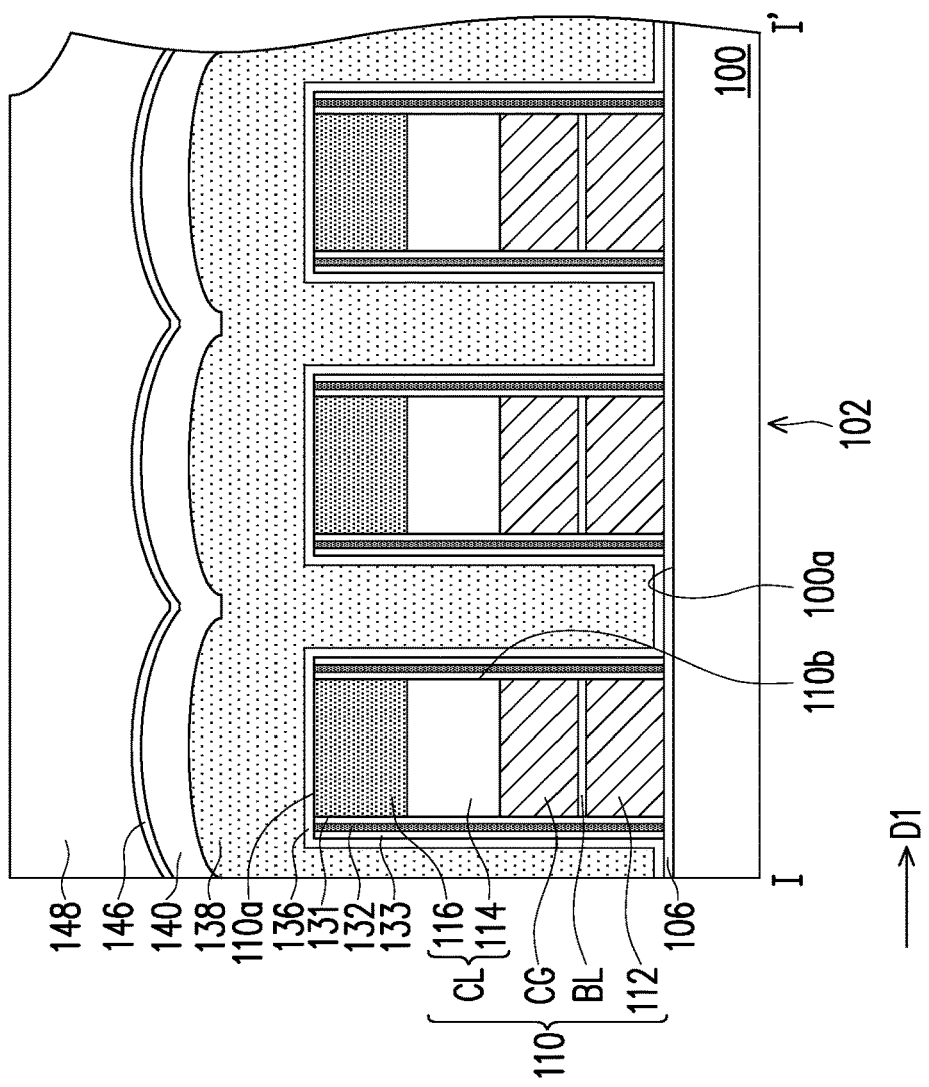
FIG. 8A
FIG. 8B

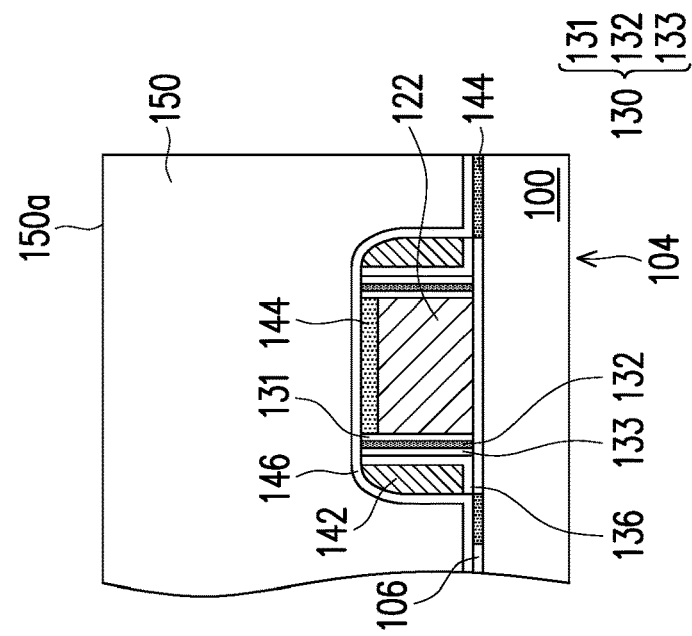
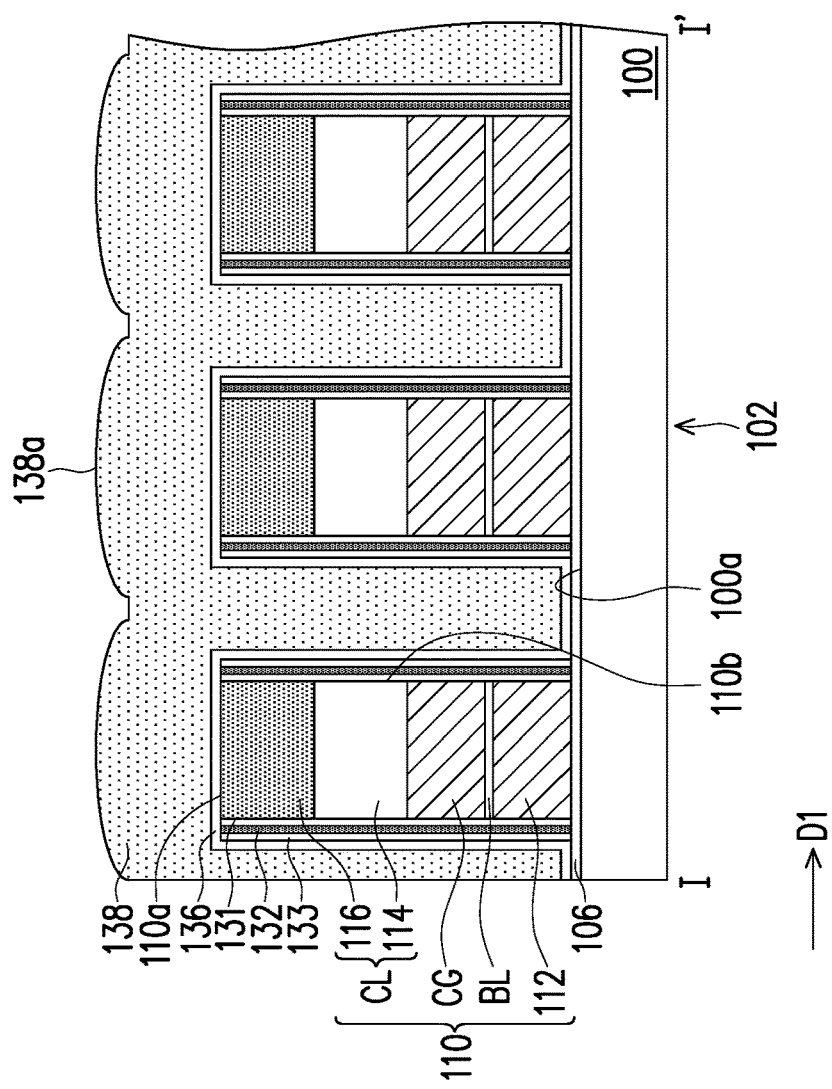
FIG. 9B
FIG. 9A

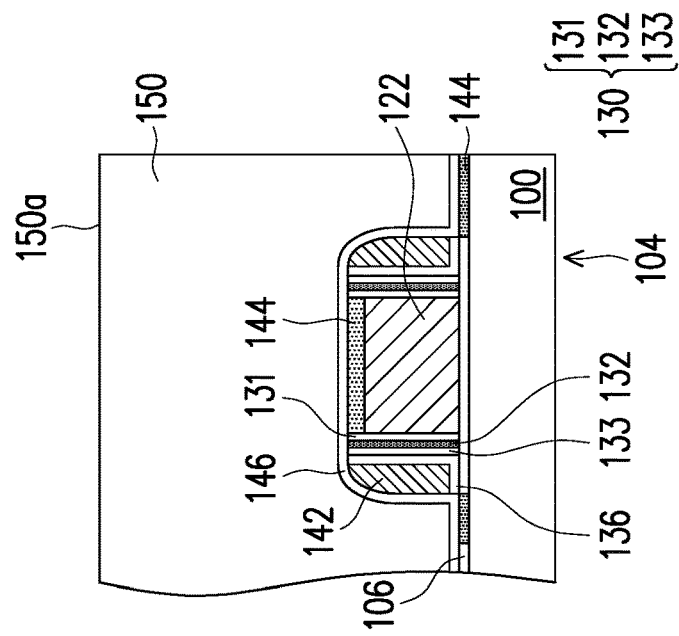
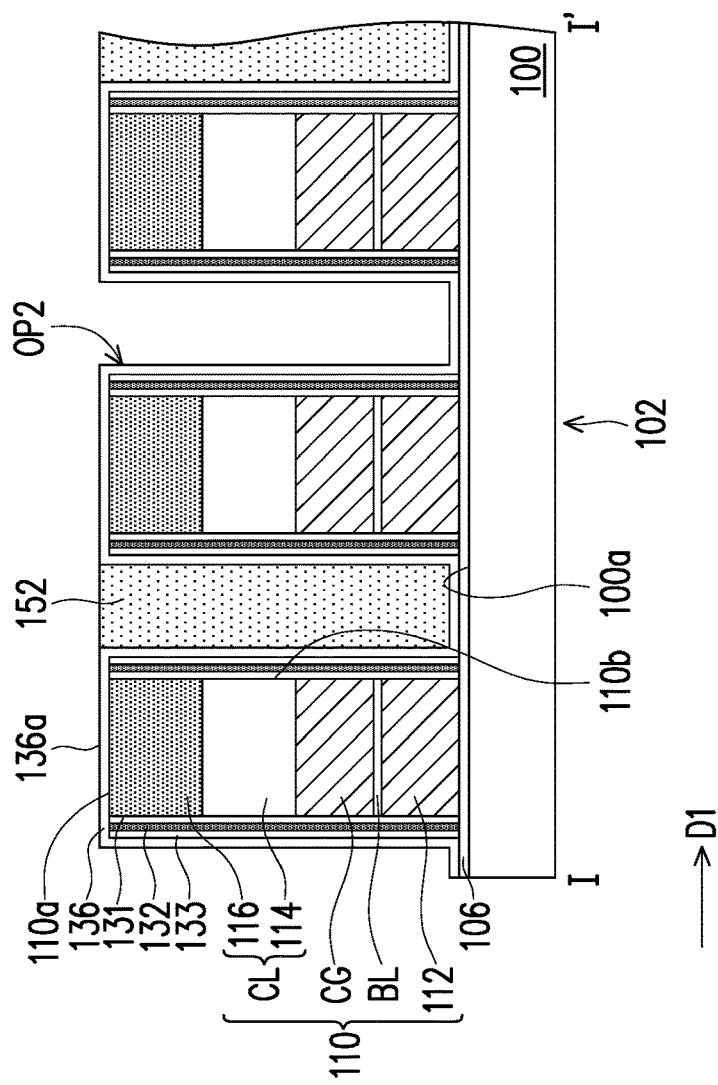
FIG. 12A
FIG. 12B

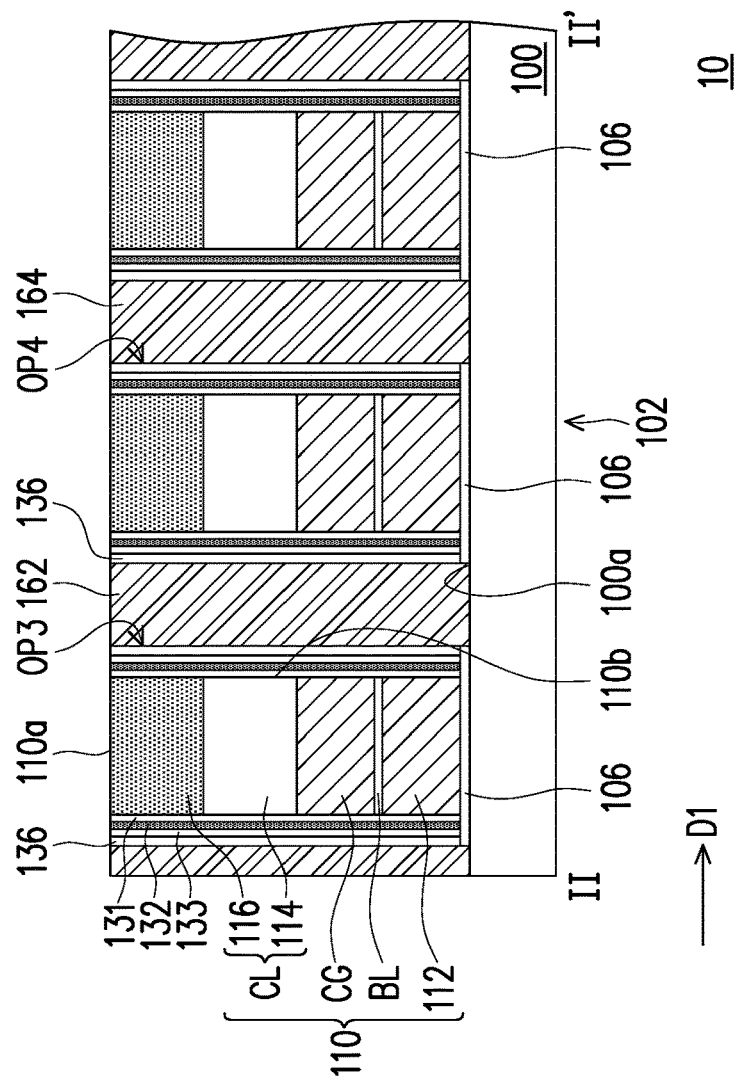
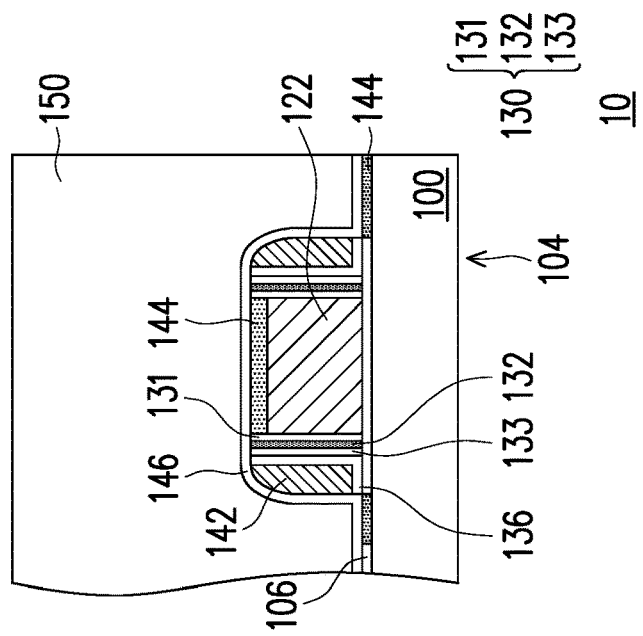
FIG. 17C
FIG. 17D

MEMORY DEVICE AND METHOD OF MANUFACTURING THE SAME

BACKGROUND

Technical Field

The disclosure relates to a memory device and a method of manufacturing the memory device, and in particular, to a memory device including a cap layer with a multilayer structure and a method of manufacturing the memory device.

Description of Related Art

As the semiconductor technology advances, the size of a semiconductor memory device is getting smaller and smaller. Due to the advantages of the light weight, the compact volume, and the low power, flash memory has gradually become more important. However, in the conventional manufacturing process of the flash memory, a protruding portion is likely to be formed at a corner above a gate. Therefore, for example, when an etching process is performed to remove dummy source contact plugs or dummy drain contact plugs and form source or drain contact openings, it is likely to cause damage to a protective layer located near the protruding portion, leading to element current leakage and reducing the reliability of the semiconductor memory device.

SUMMARY

The disclosure provides a memory device including multiple stack structures and a protective layer. The multiple stack structures are arranged along a first direction on an array area of a substrate, and each of the stack structures extends along a second direction different from the first direction. In a cross-sectional view of the memory device, each of the stack structures includes, in sequence from the substrate, a charge storage structure, a control gate, and a cap layer. The cap layer has a multilayer structure. The protective layer covers sidewalls of the stack structures. A width in the first direction of the charge storage structure, a width in the first direction of the control gate, and a width in the first direction of the cap layer are substantially equal to each other.

The disclosure provides a method of manufacturing a memory device. The method includes the following. Multiple stack structures are formed on a substrate of an array area. The multiple stack structures are arranged along a first direction, and each of the stack structures extends along a second direction different from the first direction. In a cross-sectional view of the memory device, each of the stack structures includes, in sequence from the substrate, a charge storage structure, a control gate, and a cap layer. The cap layer has a multilayer structure. A width in the first direction of the charge storage structure, a width in the first direction of the control gate, and a width in the first direction of the cap layer are substantially equal to each other. Next, a protective layer is formed on sidewalls of the stack structures. A conductor layer is formed on the substrate to fill space among the multiple stack structures. A planarization process is performed to form multiple conductor strips. At least one of the conductor strips is patterned to form multiple conductor pillars. In addition, a replacement process is performed to replace the multiple conductor strips and the multiple conductor pillars with multiple contact plugs.

Based on the above, in the disclosure, the width in the first direction of the charge storage structure, the width in the first direction of the control gate, and the width in the first direction of the cap layer are substantially equal to each other so that the stack structures have the sidewalls that are substantially flat and smooth. In this way, the protective layer may be prevented from damage, such as an etching process, and completeness of the protective layer may be maintained to further increase reliability of a device. In addition, in the manufacturing method of the disclosure, the cap layers of the stack structures may serve as polishing buffer layers. Hence, a dummy source contact plug may be directly isolated through the planarization process, and a patterning process may be simply further performed to form a dummy drain contact plug.

In order to make the aforementioned features and advantages of the disclosure comprehensible, embodiments accompanied with drawings are described in detail below.

BRIEF DESCRIPTION OF THE DRAWINGS

FIGS. 1A, 2A, 3A, 4A, 5A, 6A, 7A, 8A, 9A, 10A, 11A, 11D, 12A, 12D, 13A, 13C, 14A, 14C, 15A, 15C, 16A, 16C, 17A, and 17C are schematic cross-sectional diagrams of a manufacturing process of an array area of a memory device according to an embodiment of the disclosure.

FIGS. 1B, 2B, 3B, 4B, 5B, 6B, 7B, 8B, 9B, 10B, 11B, 11E, 12B, 12E, 13B, 13D, 14B, 14D, 15B, 15D, 16B, 16D, 17B, and 17D are schematic cross-sectional diagrams of a manufacturing process of a periphery area of a memory device according to an embodiment of the disclosure.

DESCRIPTION OF THE EMBODIMENTS

Figure 11B:
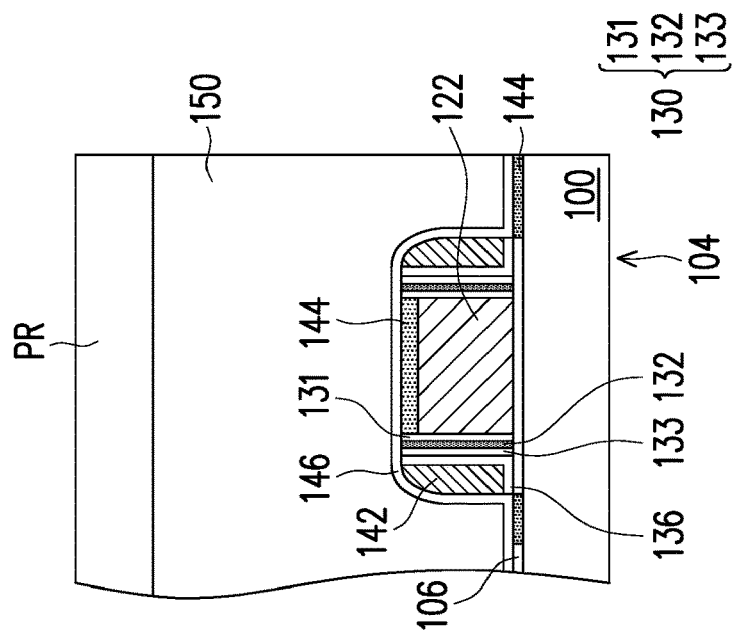
Figure 11A:
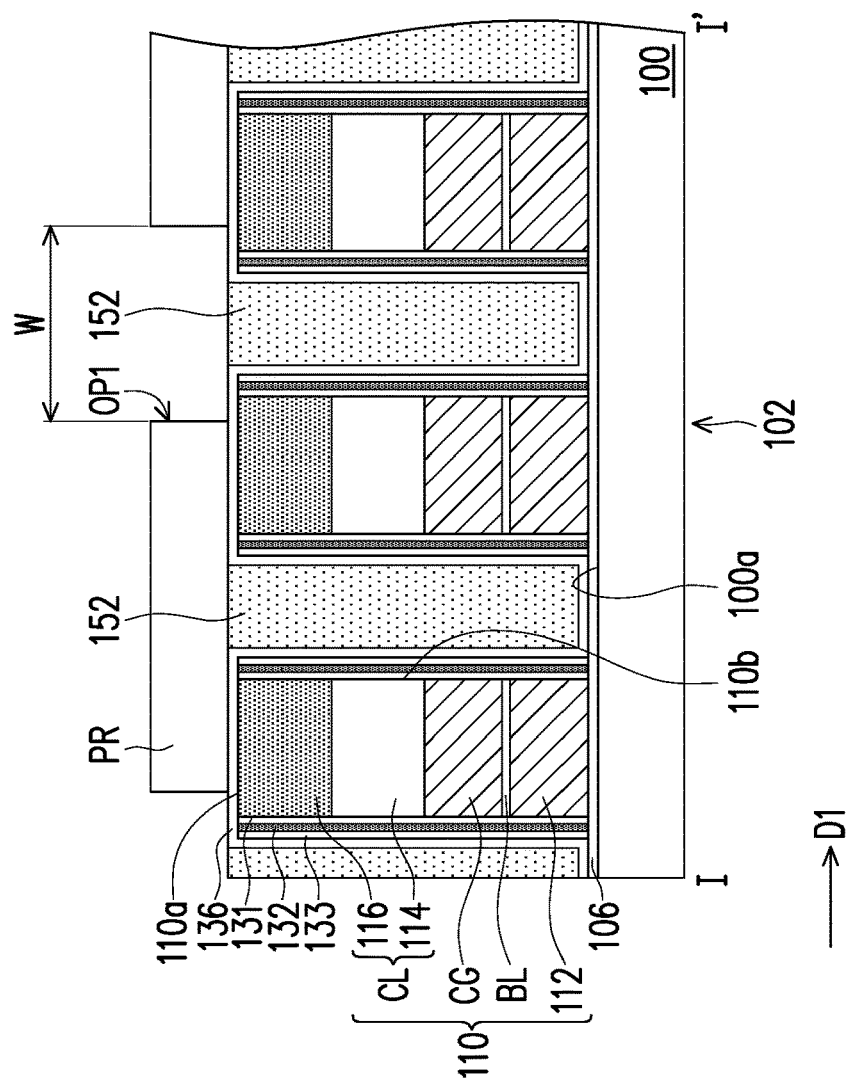
Figure 11C:
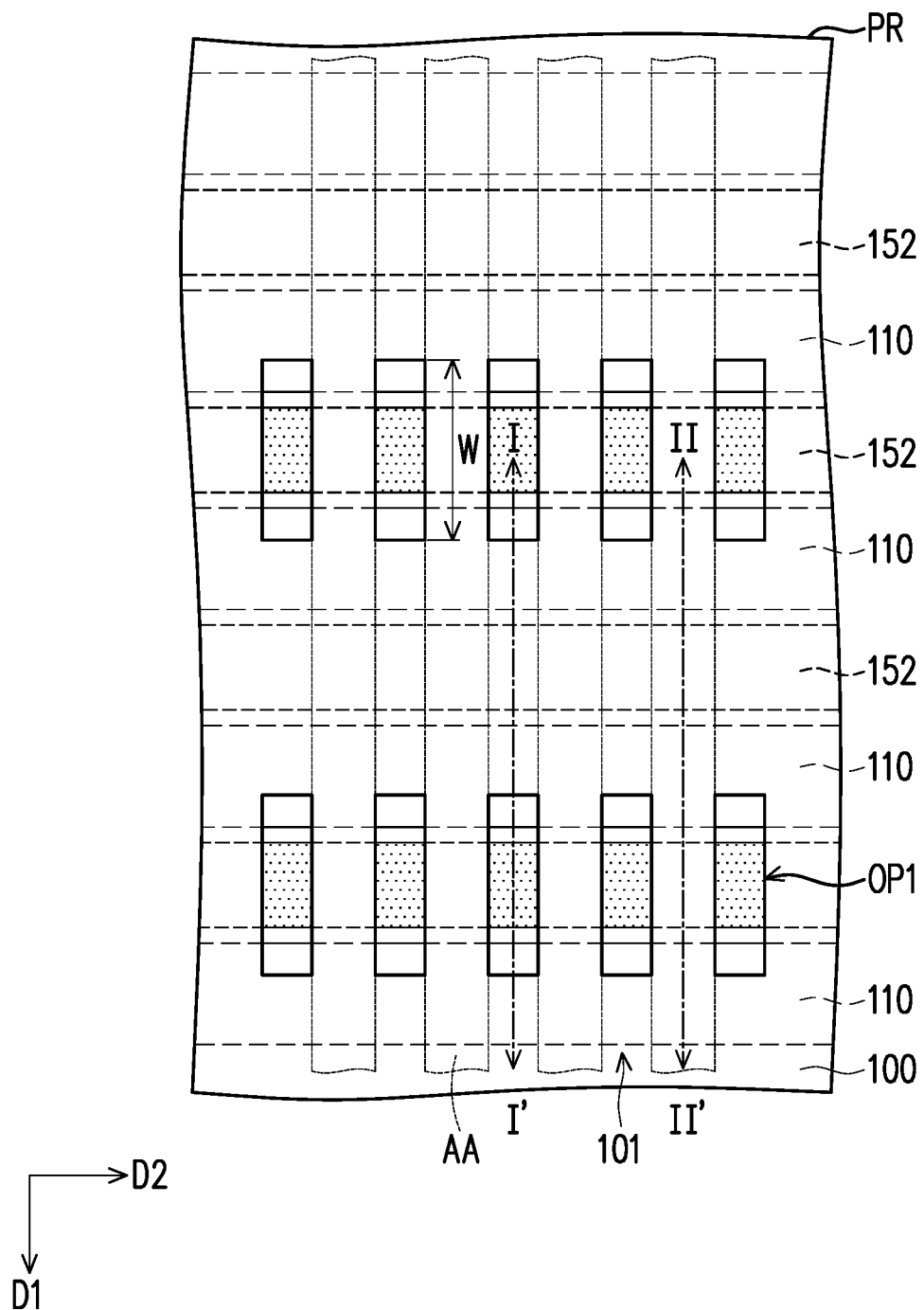
Figure 11E:
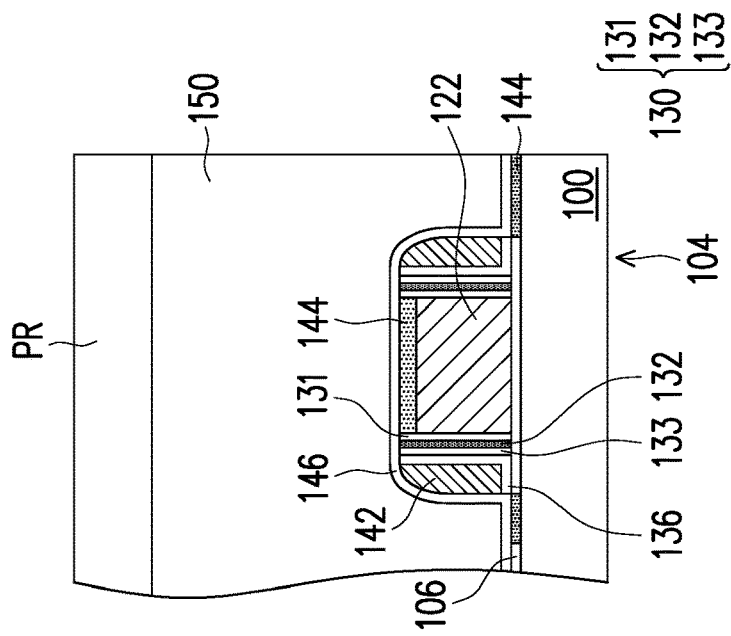
Figure 11D:
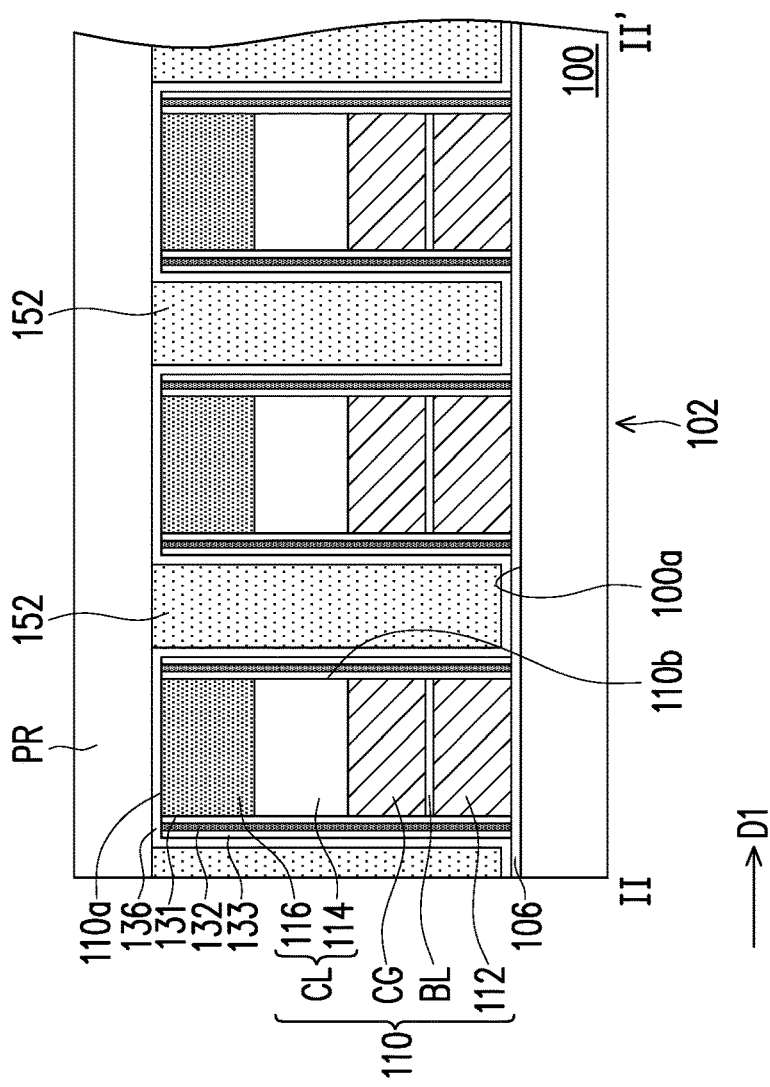
Figure 12C:
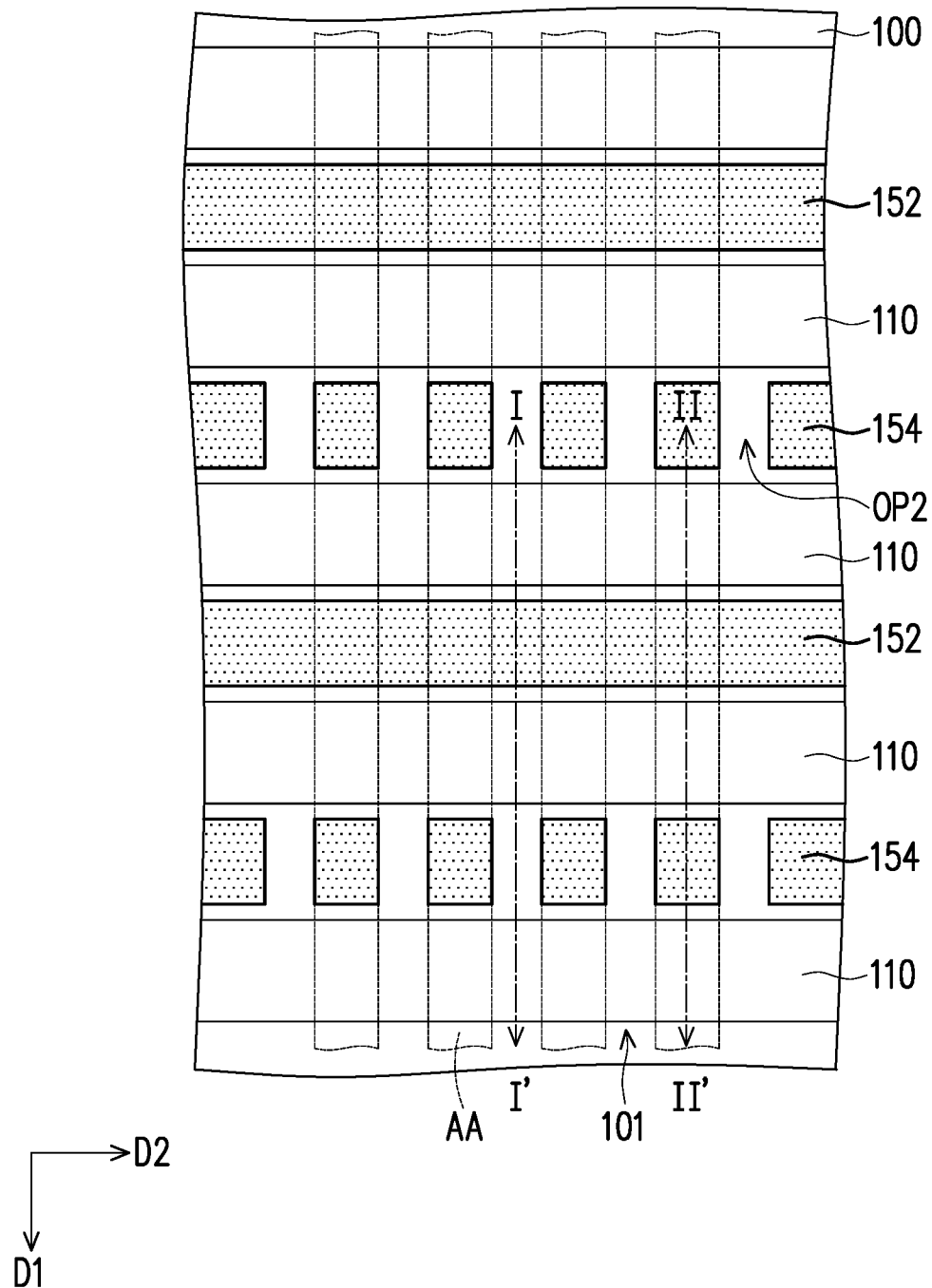
Figure 12D:
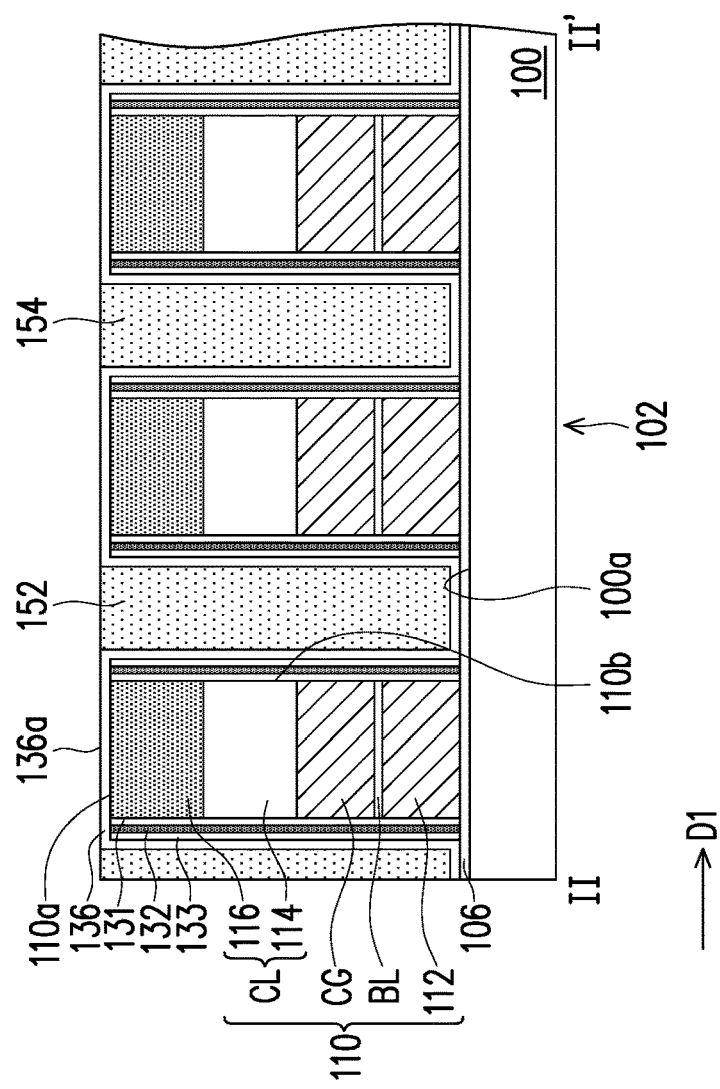
Figure 12E:
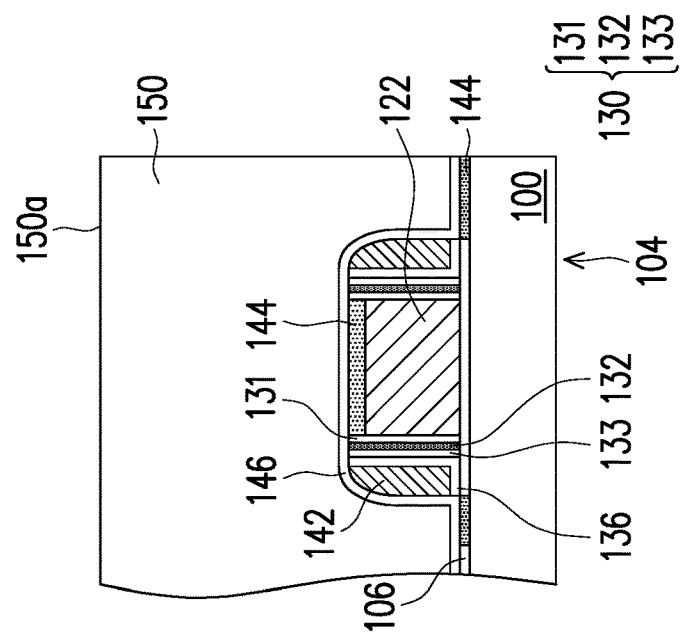
Figure 13B:
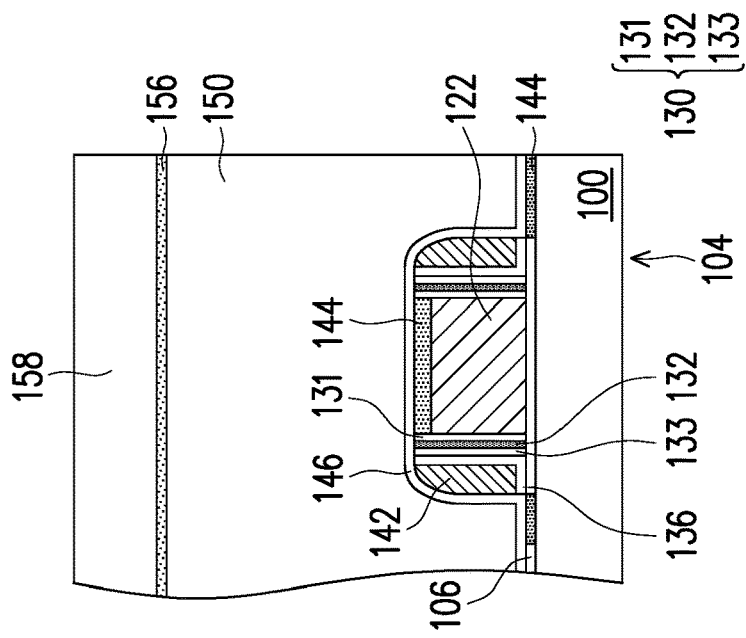
Figure 13A:
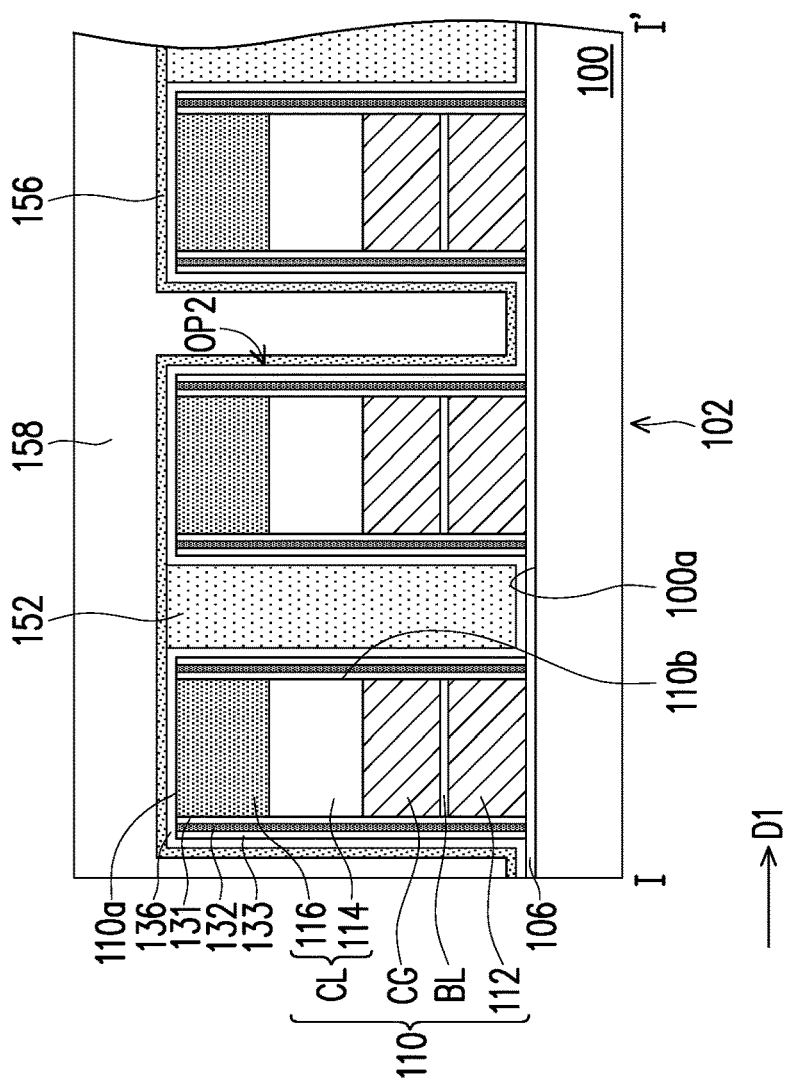
Figures 13C, 13D:
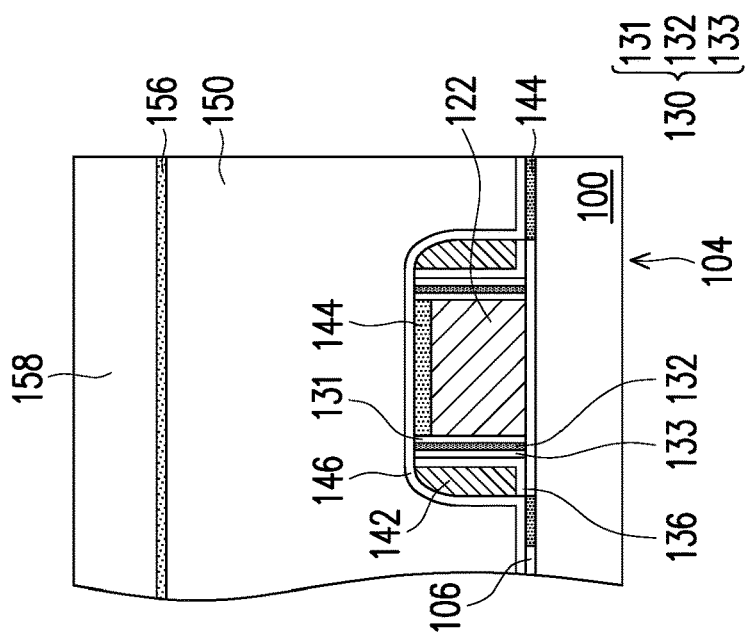
Figure 14B:
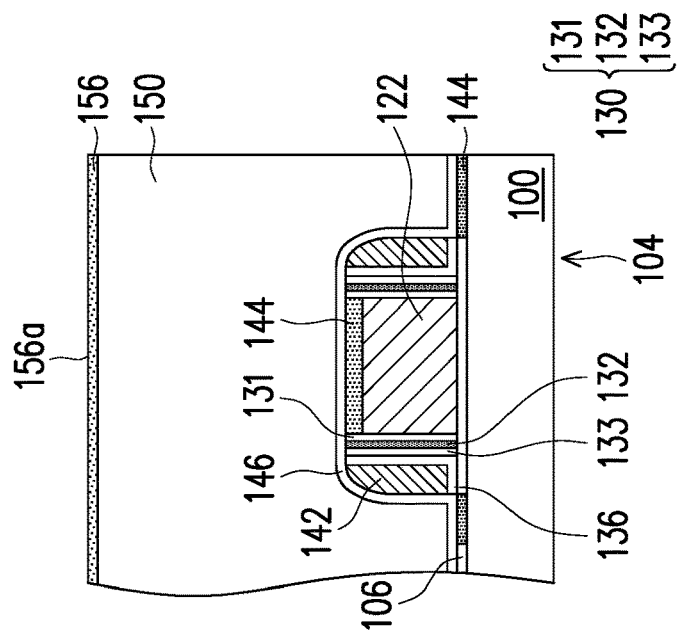
Figure 14A:
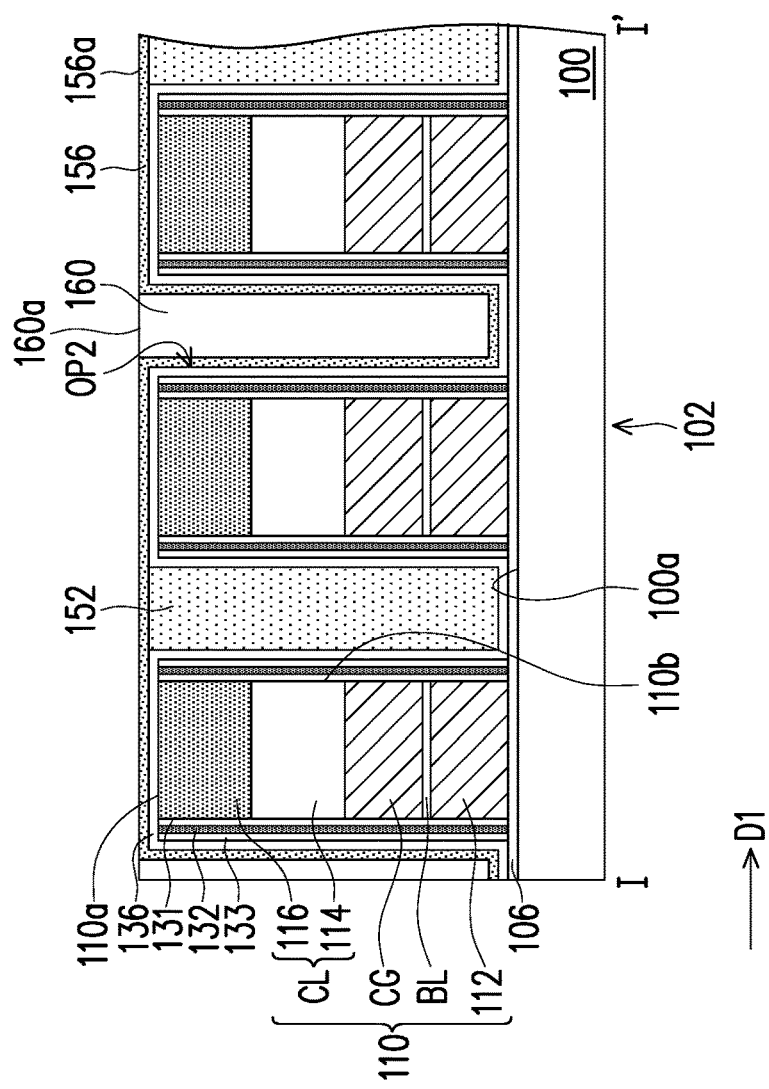
Figure 14D:
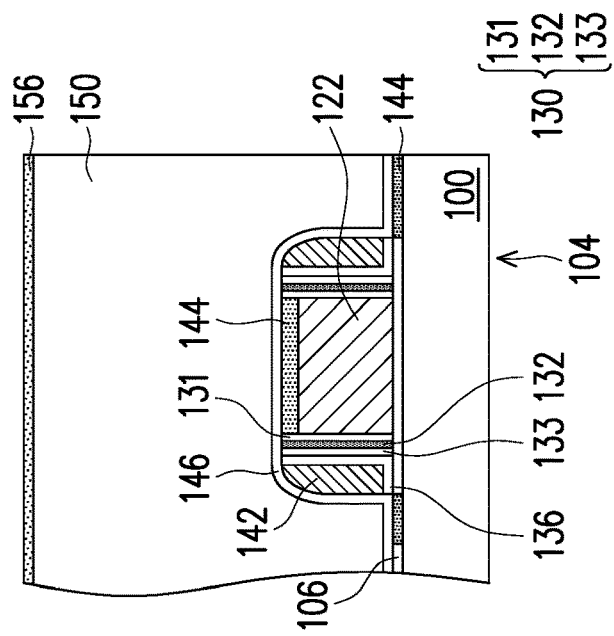
Figure 14C:
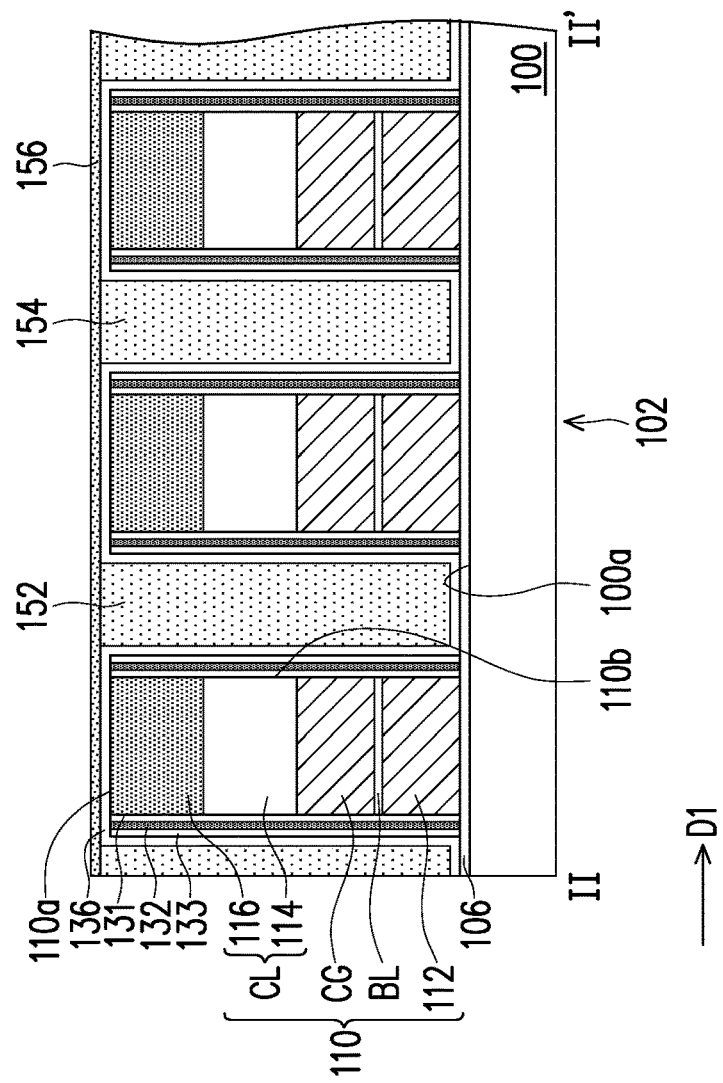
Figure 15A:
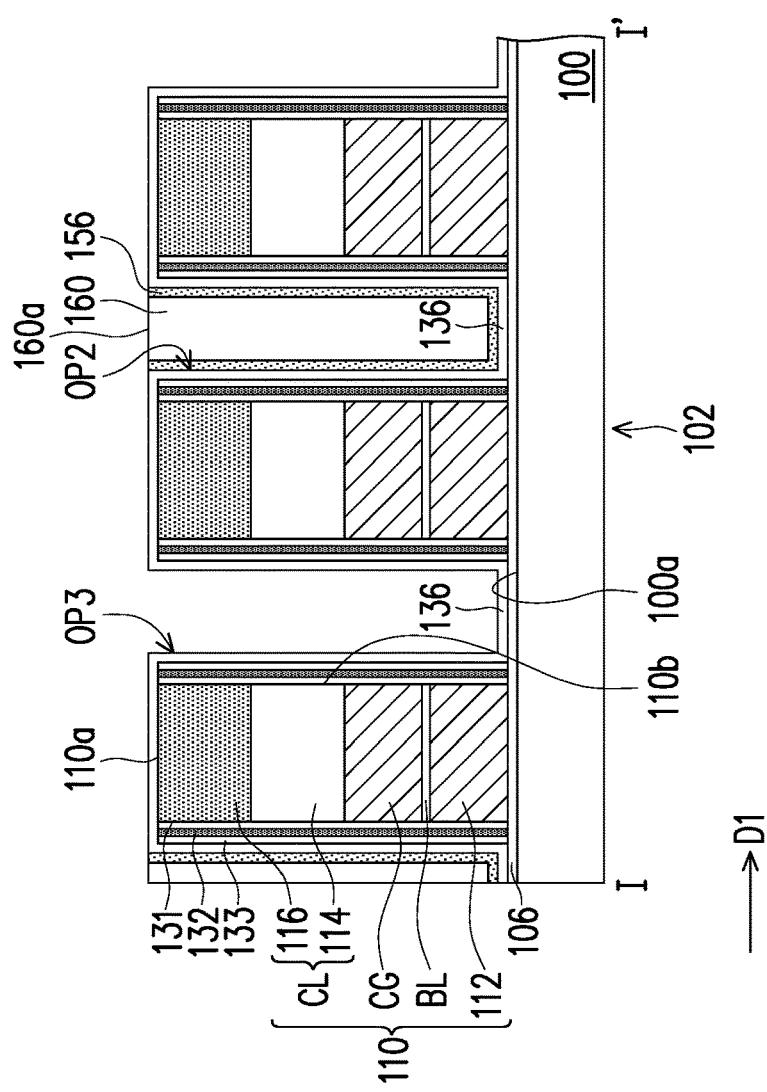
Figure 15B:
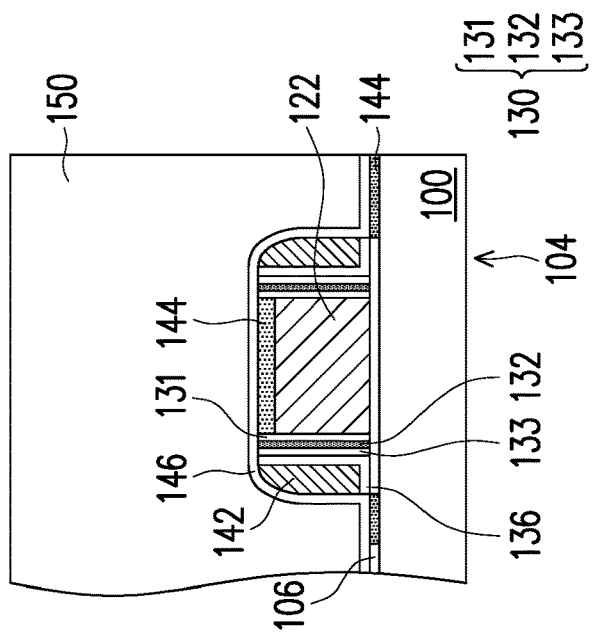
Figure 15D:
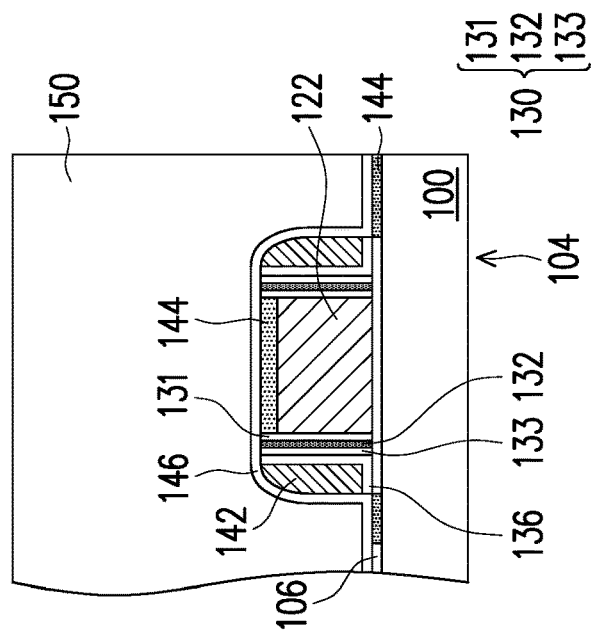
Figure 15C:
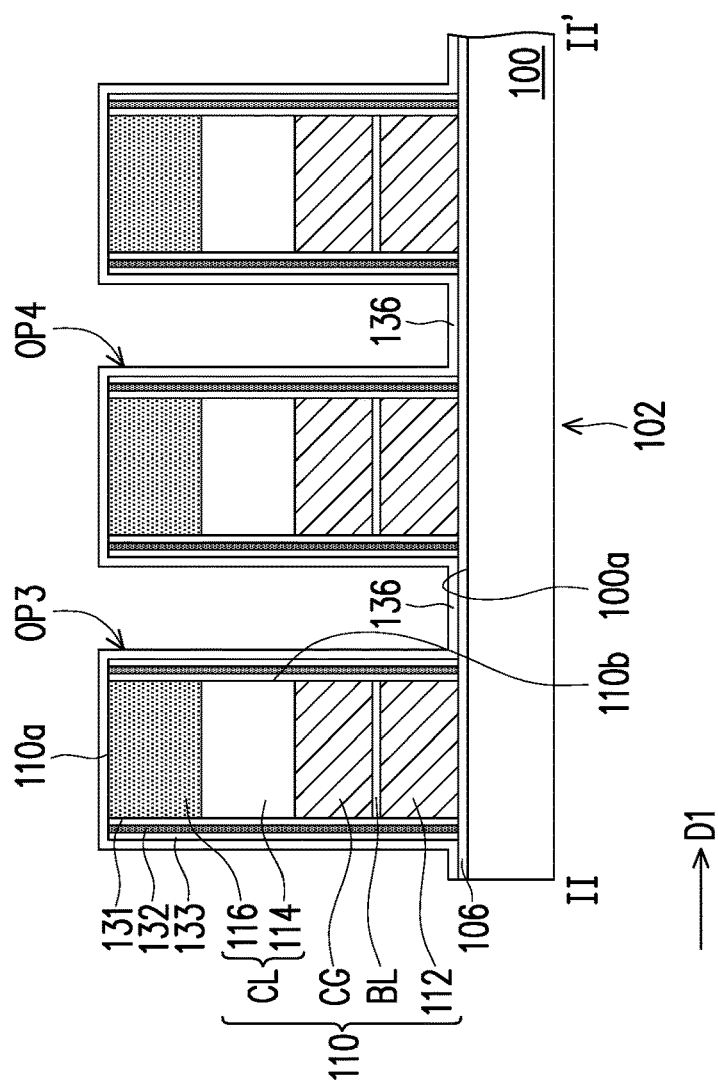
Figure 16B:
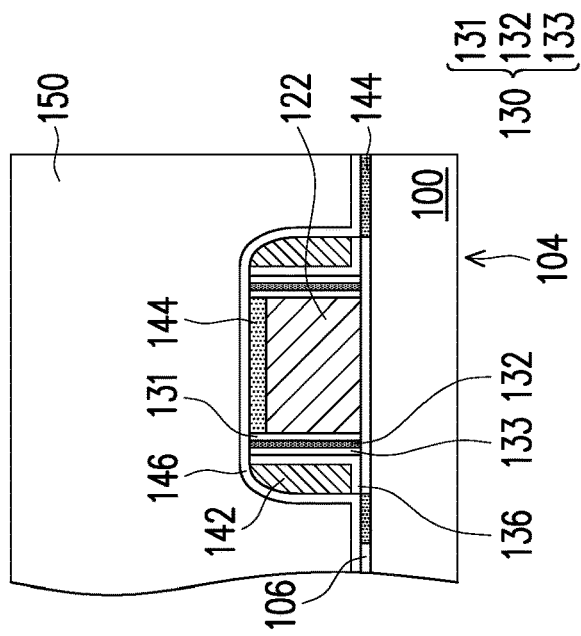
Figure 16A:
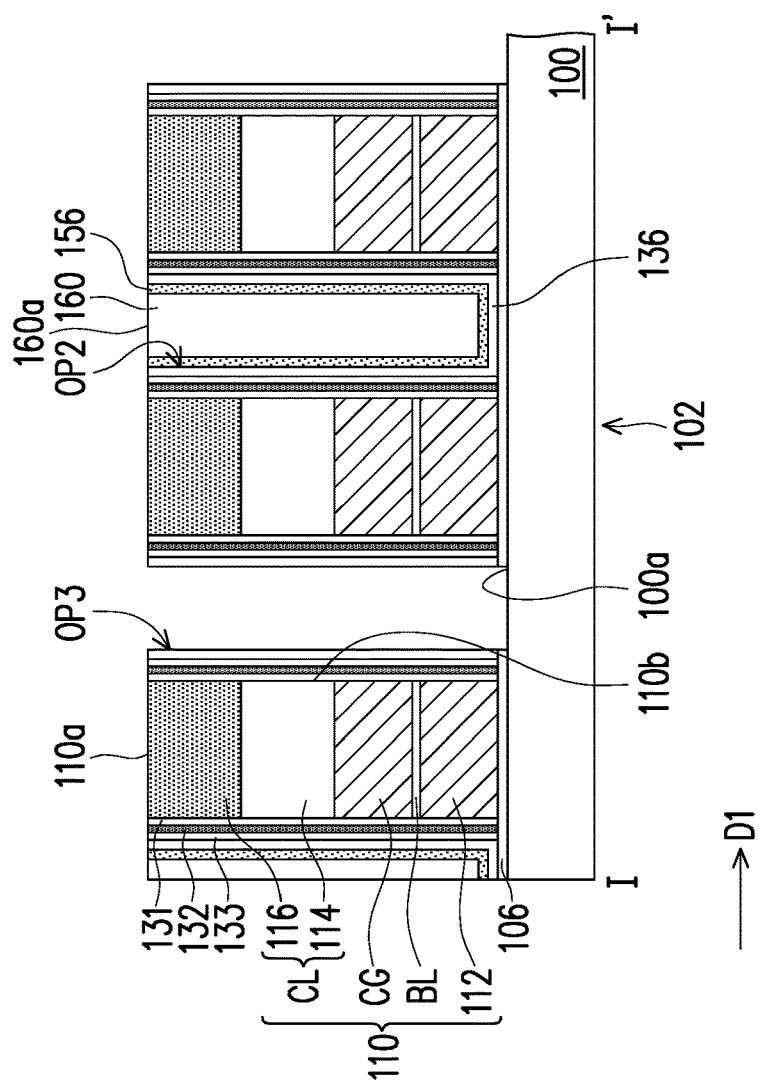
Figure 16D:
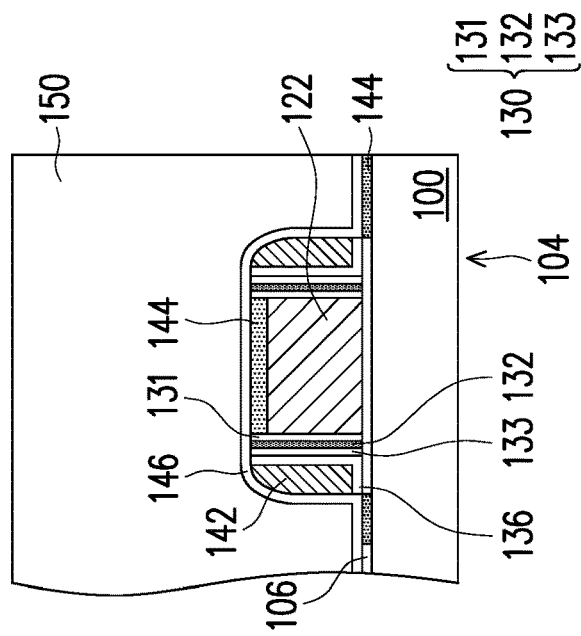
Figure 16C:
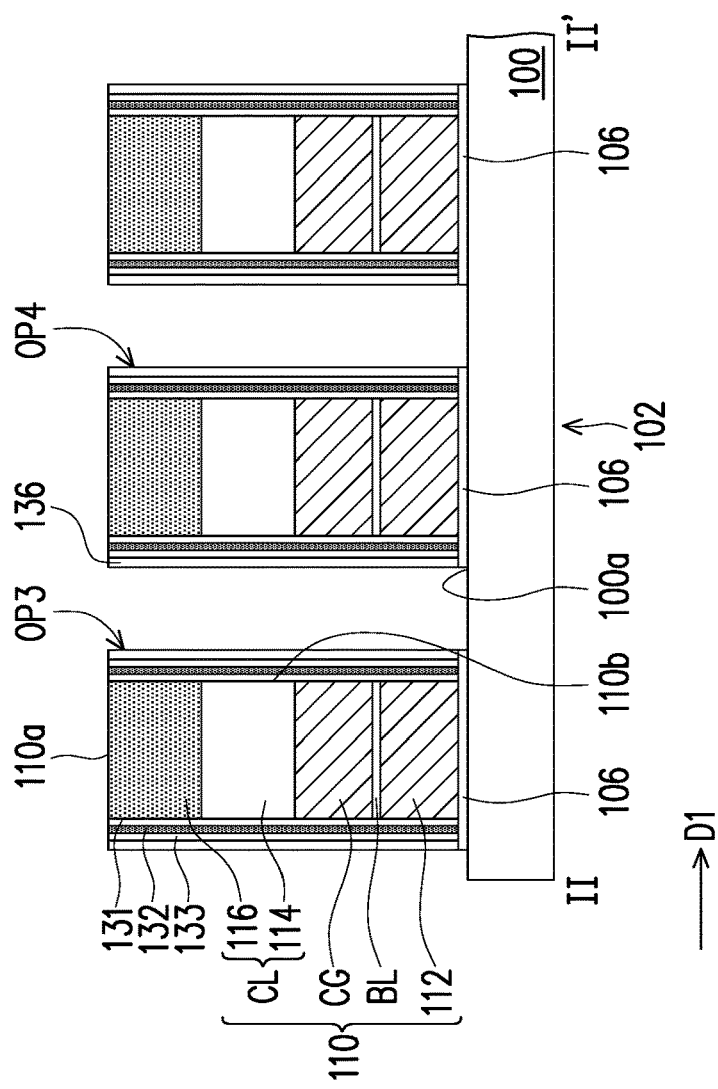
Figure 17A:
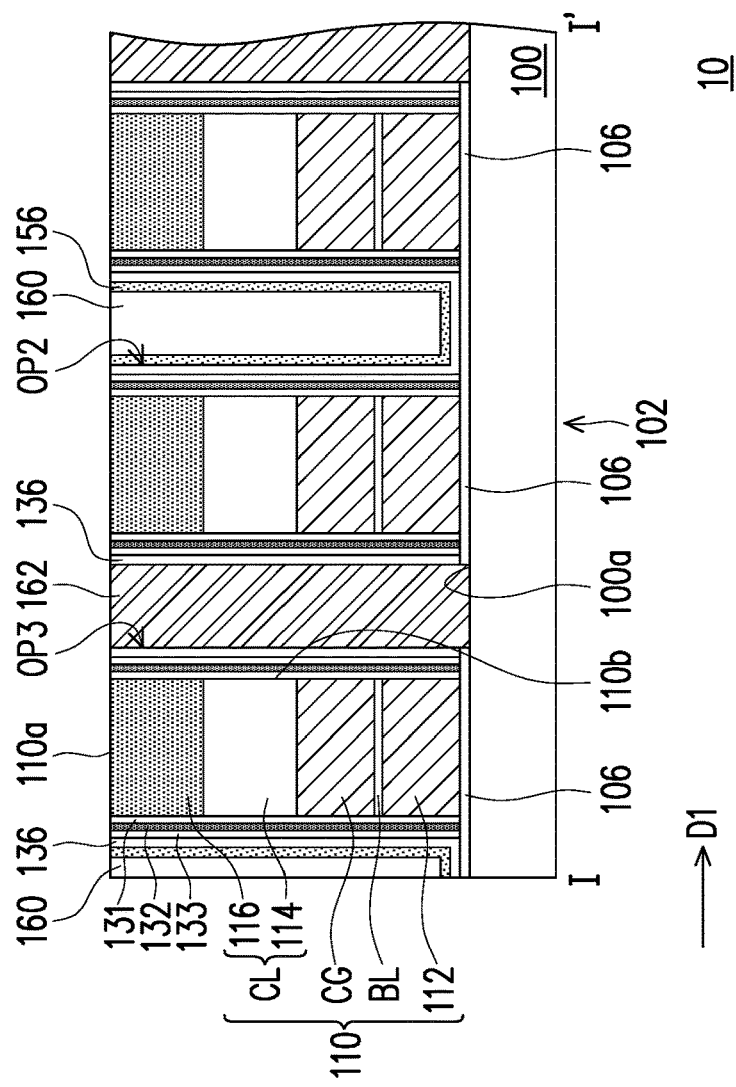
Figure 17B:
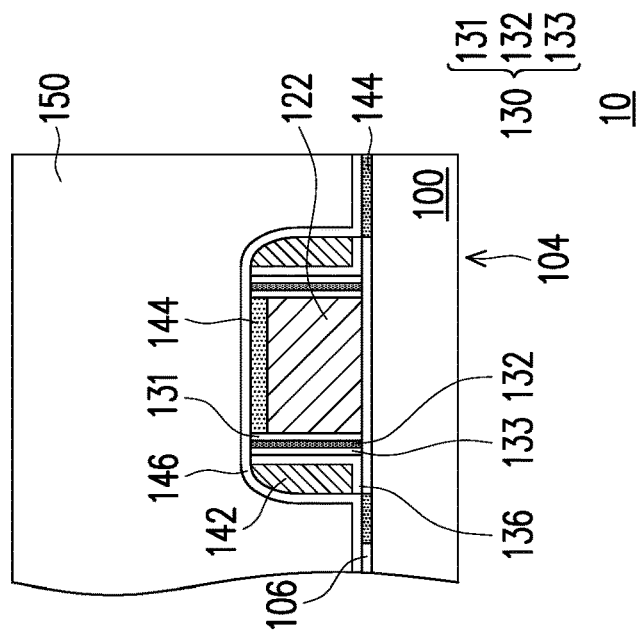

FIGS. 1A, 2A, 3A, 4A, 5A, 6A, 7A, 8A, 9A, 10A, 11A, 11D, 12A, 12D, 13A, 13C, 14A, 14C, 15A, 15C, 16A, 16C, 17A, and 17C are schematic cross-sectional diagrams of a manufacturing process of an array area of a memory device according to an embodiment of the disclosure. FIGS. 1B, 2B, 3B, 4B, 5B, 6B, 7B, 8B, 9B, 10B, 11B, 11E, 12B, 12E, 13B, 13D, 14B, 14D, 15B, 15D, 16B, 16D, 17B, and 17D are schematic cross-sectional diagrams of a manufacturing process of a periphery area of a memory device according to an embodiment of the disclosure. FIGS. 1C, 11C, and 12C are respectively top views of FIGS. 1A, 11A, and 12A. Note that FIGS. 1A, 11A, and 12A are respectively schematic cross-sectional diagrams of FIGS. 1C, 11C, and 12C along a line I-I', and FIGS. 11D and 12D are respectively schematic cross-sectional diagrams of FIGS. 11C and 12C along a line II-II'.

Figures 1A, 1B:
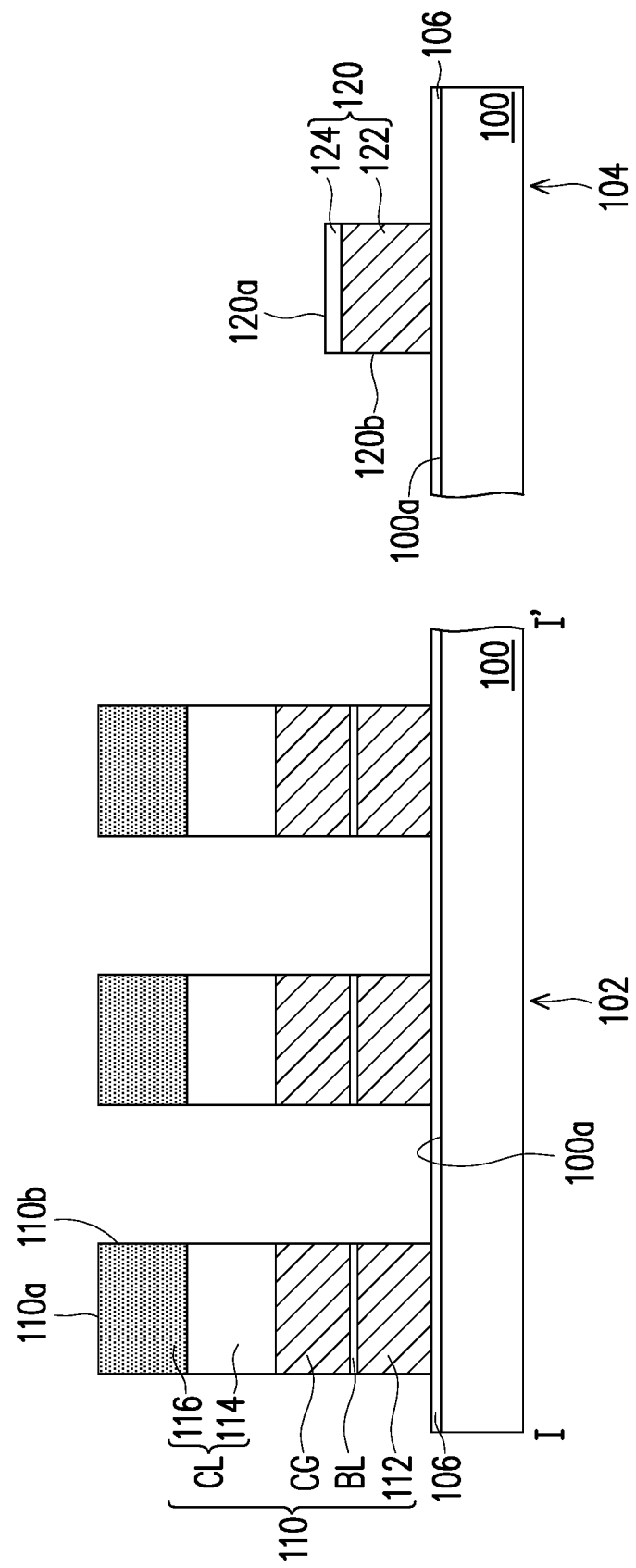
Figure 1C:
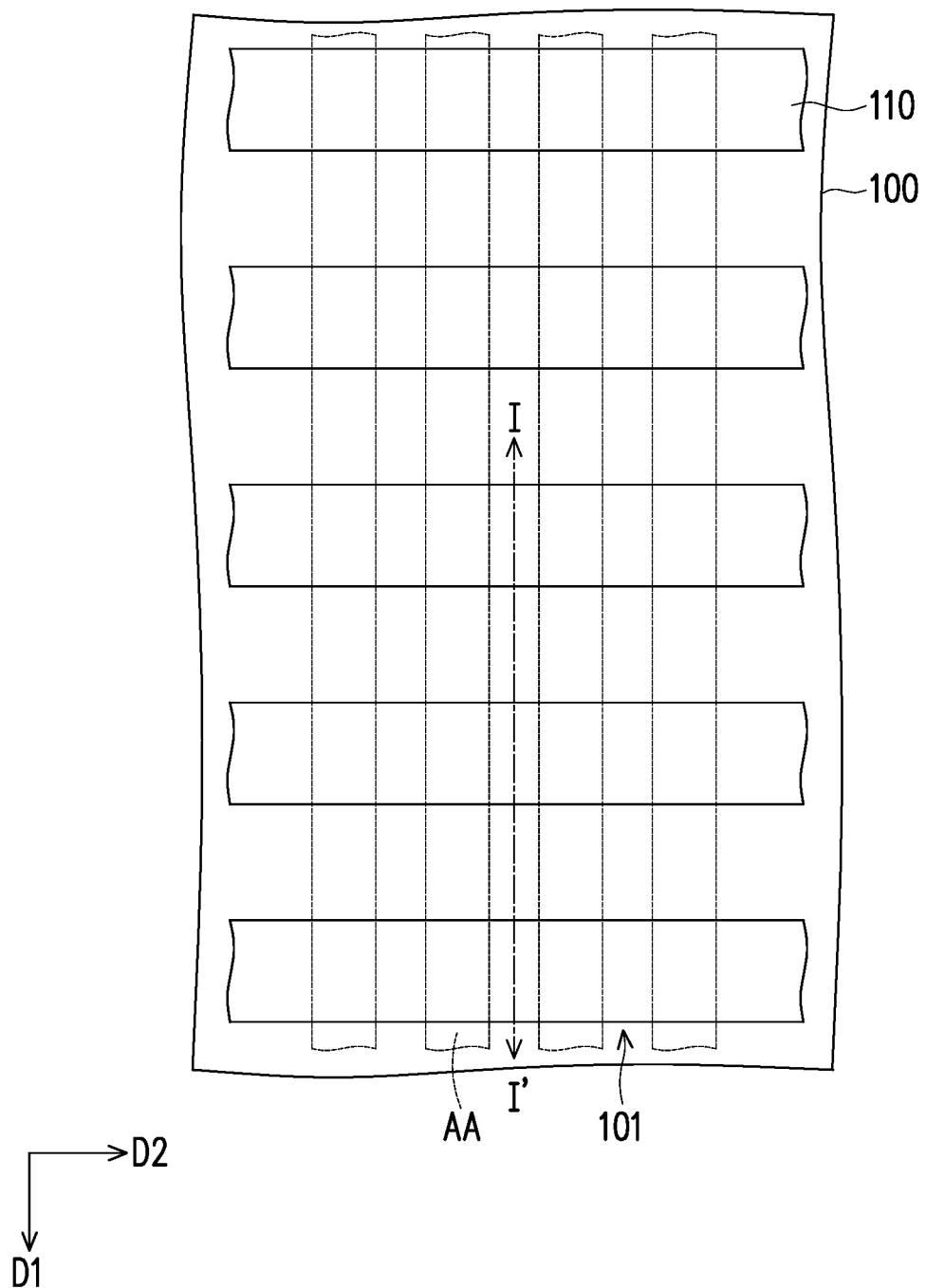
FIGS. 1C, 11C, and 12C are respectively top views of FIGS. 1A, 11A, and 12A.

First, referring to FIGS. 1A to 1C together, a substrate 100 is provided. The substrate 100 includes an array area 102 and a periphery area 104. As shown in FIG. 1C, isolation structures 101 are disposed in the substrate 100 to define multiple active areas AA of the substrate 100. The active areas AA, for example, extend along a first direction D1. In an embodiment, the substrate 100 is, for example, a silicon substrate. The isolation structures 101 may be shallow trench isolation (STI) structures. As shown in FIGS. 1A and 1B, a tunneling dielectric layer 106 may be formed on a surface 100a of the substrate 100. In an embodiment, a material of the tunneling dielectric layer 106 may include a dielectric material such as silicon dioxide.

Multiple first stack structures 110 are disposed on the substrate 100 of the array area 102, and multiple second stack structures 120 are disposed on the substrate 100 of the periphery area 104. As shown in FIGS. 1A and 1B, a height of the first stack structures 110 is, for example, greater than a height of the second stack structures 120. As shown in FIG. 1C, the first stack structures 110 may be structures in a shape of a strip and disposed across the active areas AA. In other words, the first stack structures 110 extend along a second direction D2 different from the first direction D1. In the embodiment, the second direction D2 is perpendicular or orthogonal to the first direction D1; however, the disclosure is not limited thereto. In addition, only one second stack structure 120 is illustrated in FIGS. 1A and 1B, and only five first stack structures 110 are illustrated in FIG. 1C. However, in other embodiments, a number of the first stack structures 110 and a number of the second stack structures 120 may be adjusted according to design requirements, and the disclosure is not limited thereto.

In the embodiment, each first stack structure 110 includes, in sequence from bottom to top, a charge storage structure 112, a barrier layer BL, a control gate CG, and a cap layer CL. In the cross-sectional diagram FIG. 1A, each sidewall 110b of the first stack structure 110 is substantially arranged as a straight line. Specifically, sidewalls at the same side of the charge storage structure 112, the control gate CG, and the cap layer CL are, for example, located at the same straight line parallel to a normal vector of the substrate 100. In other words, a width in the first direction D1 of the charge storage structure 112, a width in the first direction D1 of the control gate CG, and a width in the first direction D1 of the cap layer CL are substantially equal to each other. In this way, the first stack structures 110 may have the sidewalls 110b that are substantially flat and smooth. Hence, in a further manufacturing process, when a protective layer or the like is formed on the sidewalls 110b of the first stack structures 110, a protruding portion may be prevented to ensure that the protective layer on the sidewalls 110b has a flat and smooth surface. In an embodiment, the barrier layer BL may be viewed as an inter-gate dielectric layer and may be a composite layer composed of oxide-nitride-oxide (ONO). A material of the control gate CG includes a conductor material, such as doped polysilicon, undoped polysilicon, or the combination thereof.

In the embodiment, the charge storage structure 112 is adapted to store electric charge. In an embodiment, the charge storage structure 112 may include a floating gate; however, the disclosure is not limited thereto. A material of the floating gate includes a conductor material, such as doped polysilicon, undoped polysilicon, or the combination thereof.

In the embodiment, the cap layer CL has a multilayer structure. For example, the cap layer CL may include a dielectric layer 114 and a hard mask layer 116. The dielectric layer 114 is, for example, disposed between the control gate CG and the hard mask layer 116. A width in the first direction D1 of the dielectric layer 114 is substantially equal to a width in the first direction D1 of the hard mask layer 116. In this way, it may be ensured that in the further manufacturing process, even when the protective layer or the like is formed on a sidewall of the cap layer CL, a flat and smooth surface may be maintained. In the embodiment, a thickness of the hard mask layer 116 is, for example, 100 nm to 150 nm. In addition, a material of the hard mask layer 116 is, for example, silicon nitride; however, the disclosure is not limited thereto. In other embodiments, other suitable thickness and/or hard mask material of the hard mask layer 116 may be adopted, as long as it may block polishing in a process such as a chemical mechanical polishing process. In an embodiment, a material of the dielectric layer 114 may include a dielectric material such as silicon dioxide.

In the embodiment, each second stack structure 120 includes, for example, in sequence from bottom to top, a gate 122 and a dielectric layer 124. In an embodiment, a material of the gate 122 includes a conductor material, such as doped polysilicon, undoped polysilicon, or the combination thereof. A material of the dielectric layer 124 is, for example, silicon dioxide and the like.

Next, referring to FIGS. 2A and 2B together, a spacer material layer 131A, a spacer material layer 132A, and a spacer material layer 133A are, for example, sequentially formed on the substrate 100, the first stack structures 110, and the second stack structures 120. For example, in the array area 102, the spacer material layer 131A, the spacer material layer 132A, and the spacer material layer 133A sequentially and conformally cover the surface 100a of the substrate 100 and top surfaces 110a and the sidewalls 110b of the first stack structures 110. In the periphery area 104, the spacer material layer 131A, the spacer material layer 132A, and the spacer material layer 133A sequentially and conformally cover the surface 100a of the substrate 100 and top surfaces 120a and sidewalls 120b of the second stack structures 120. In an embodiment, a method of forming the spacer material layer 131A, the spacer material layer 132A, and the spacer material layer 133A is, for example, deposition. A material of the spacer material layer 131A may be silicon dioxide and the like. A material of the spacer material layer 132A may be silicon nitride and the like. A material of the spacer material layer 133A may be silicon dioxide and the like.

Figures 3A, 3B:
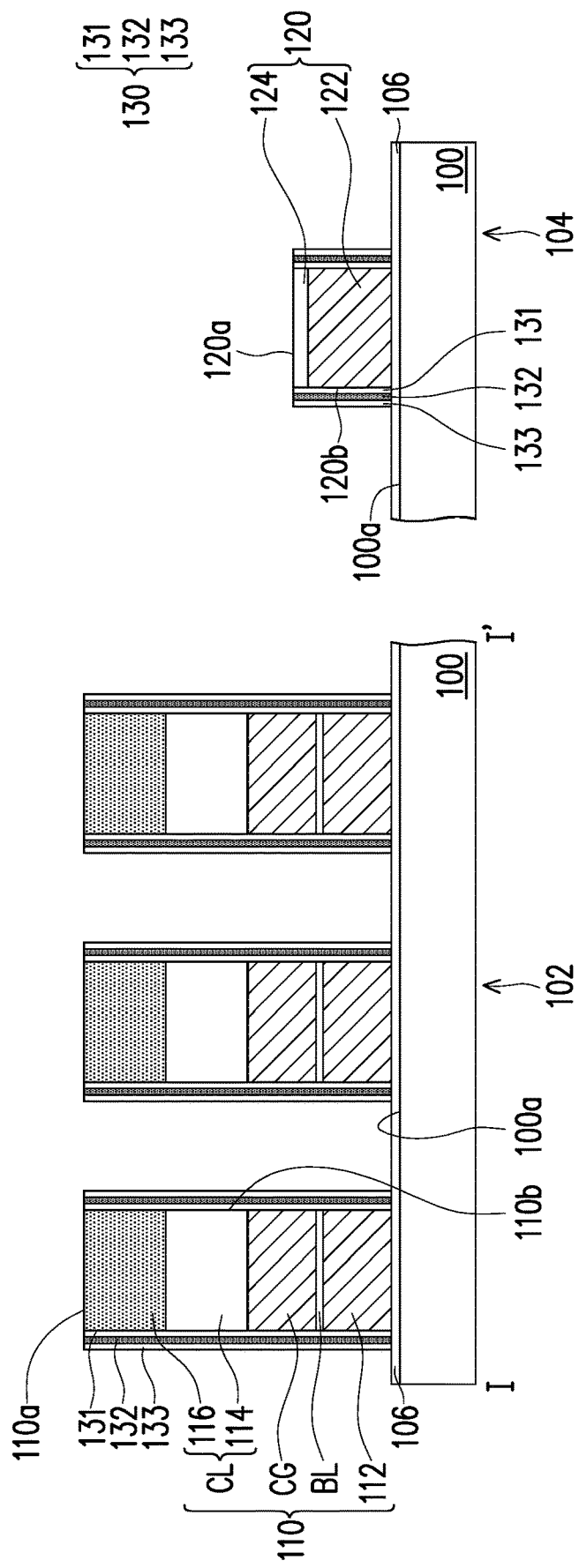

Next, referring to FIGS. 3A and 3B together, a portion of the spacer material layer 131A, a portion of the spacer material layer 132A, and a portion of the spacer material layer 133A are removed so that the top surfaces 110a of the first stack structures 110, the top surfaces 120a of the second stack structures 120, and a portion of the tunneling dielectric layer 106 are exposed, and a spacer layer 131, a spacer layer 132, and a spacer layer 133 (referred to as a spacer layer 130 altogether below) are formed on the sidewalls 110b of the first stack structures 110 and the sidewalls 120b of the second stack structures 120. In an embodiment, a method of removing the portion of the spacer material layer 131A, the portion of the spacer material layer 132A, and the portion of the spacer material layer 133A is, for example, performing an anisotropic etching process; however, the disclosure is not limited thereto.

Next, referring to FIGS. 4A and 4B together, a protective layer 136 is conformally formed on the substrate 100. In the embodiment, the first stack structures 110 have the substantially flat and smooth sidewalls 110b to ensure that the protective layer 136 formed on the sidewalls 110b has a substantially flat and smooth surface. In an embodiment, a method of forming the protective layer 136 is, for example, deposition. A material of the protective layer 136 may be silicon nitride and the like.

Figure 5A:
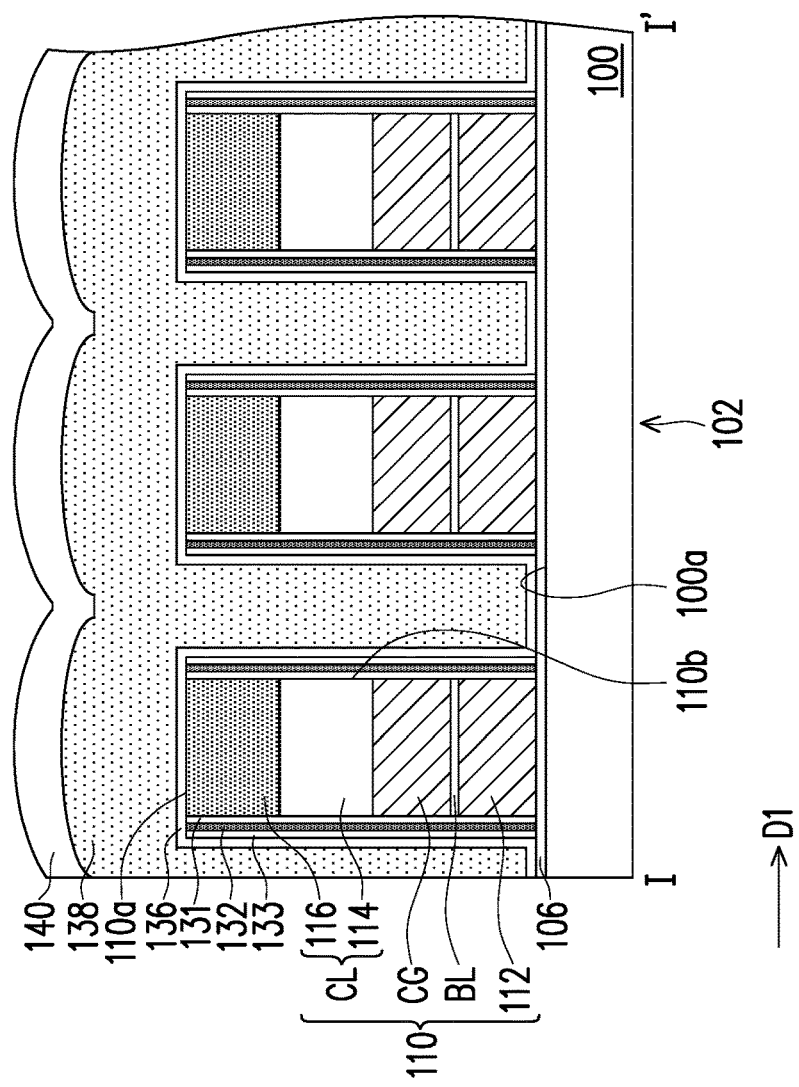
Figure 5B:
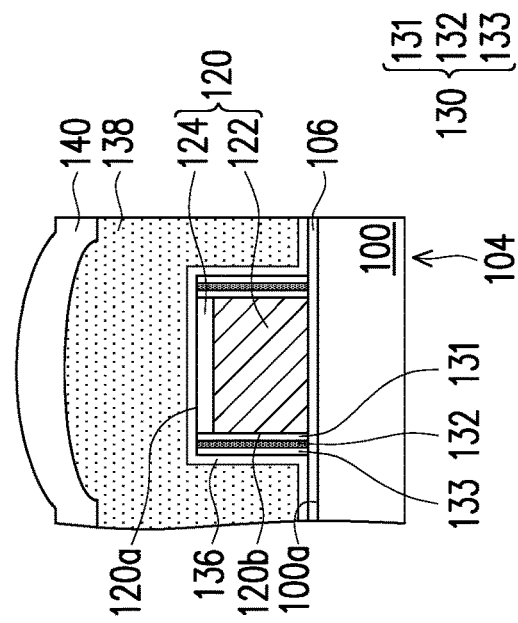

Next, referring to FIGS. 5A and 5B together, a conductor layer 138 is disposed on the protective layer 136. In the embodiment, a height of the conductor layer 138 is greater than the height of the first stack structures 110 and the height of the second stack structures 120. In the embodiment, a height of the conductor layer 138 located in the array area 102 is, for example, greater than a height of the conductor layer 138 located in the periphery area 104. Next, a hard mask layer 140 is formed on the conductor layer 138. In an embodiment, a material of the conductor layer 138 may be, for example, doped polysilicon, undoped polysilicon, or the combination thereof. A material of the hard mask layer 140 may be a suitable material, such as silicon nitride and the like.

Next, referring to FIGS. 6A and 6B together, a spacer 142 is formed on the sidewalls 120b of the second stack structures 120. A method of forming the spacer 142 includes, for example, the following; however, the disclosure is not limited thereto. First, a photoresist pattern layer (not shown) is formed on the hard mask layer 140 located in the array area 102, and an etching process is performed with the photoresist pattern layer as a mask to remove the conductor layer 138 and the hard mask layer 140 located in the periphery area 104 to expose the second stack structures 120. In an embodiment, the etching process may be a dry etching process in which etching is performed with different etching gas, such as a reactive ion etching (RIE) process. Next, the photoresist pattern layer is removed. A spacer material (not shown), such as silicon dioxide, is blanketly deposited on the substrate 100, and the spacer material is etched to form the spacer 142. In the embodiment, a portion of the protective layer 136 is also removed.

Next, referring to FIGS. 7A and 7B together, after the spacer 142 is formed, multiple silicide layers 144 are formed on the substrate 100 and the second stack structures 120. In an embodiment, a material of the silicide layers 144 may be, for example, $TiSi_2$, $CoSi_2$, NiSi, or the combination thereof. Next, a lining layer 146 is conformally deposited on the substrate 100. In an embodiment, a material of the lining layer 146 may be silicon nitride and the like.

Next, referring to FIGS. 8A and 8B together, an oxide layer 148 is blanketly formed on the substrate 100. In the embodiment, a height of the oxide layer 148 located in the array area 102 is, for example, greater than a height of the oxide layer 148 located in the periphery area 104. In an embodiment, a material of the oxide layer 148 may be silicon dioxide and the like.

Next, referring to FIGS. 9A and 9B together, for example, a wet etching process is performed to remove a portion of the oxide layer 148 and a portion of the lining layer 146, and the remaining hard mask layer 140 so that the conductor layer 138 is exposed. In the embodiment, a surface of the substrate 100 serves as a reference plane. A horizontal height of a top surface 150a of an oxide layer 150 is, for example, less than a horizontal height of a top surface 138a of the conductor layer 138. In addition, a horizontal height of the top surface 150a of the oxide layer 150 is, for example, greater than a horizontal height of the top surfaces 110a of the first stack structures 110. In other words, the horizontal height of the top surface 150a of the oxide layer 150 ranges from the horizontal height of the top surfaces 110a of the first stack structures 110 to the horizontal height of the top surface 138a of the conductor layer 138.

Figure 10B:
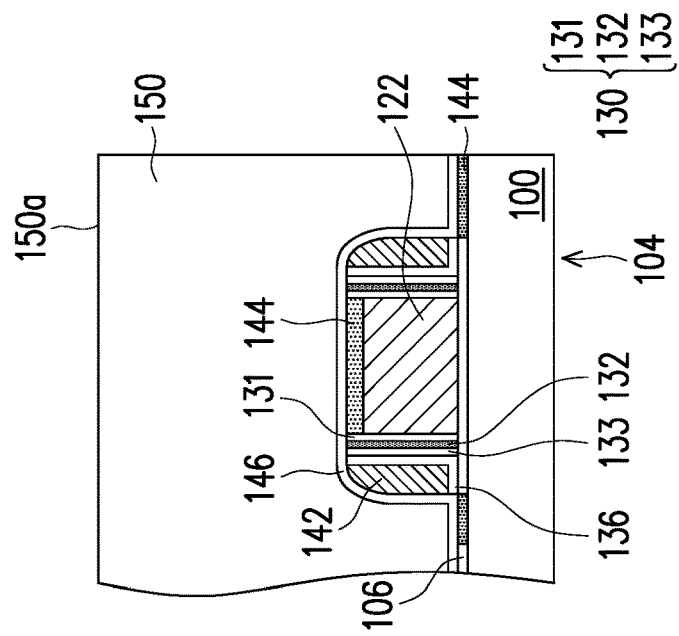
Figure 10A:
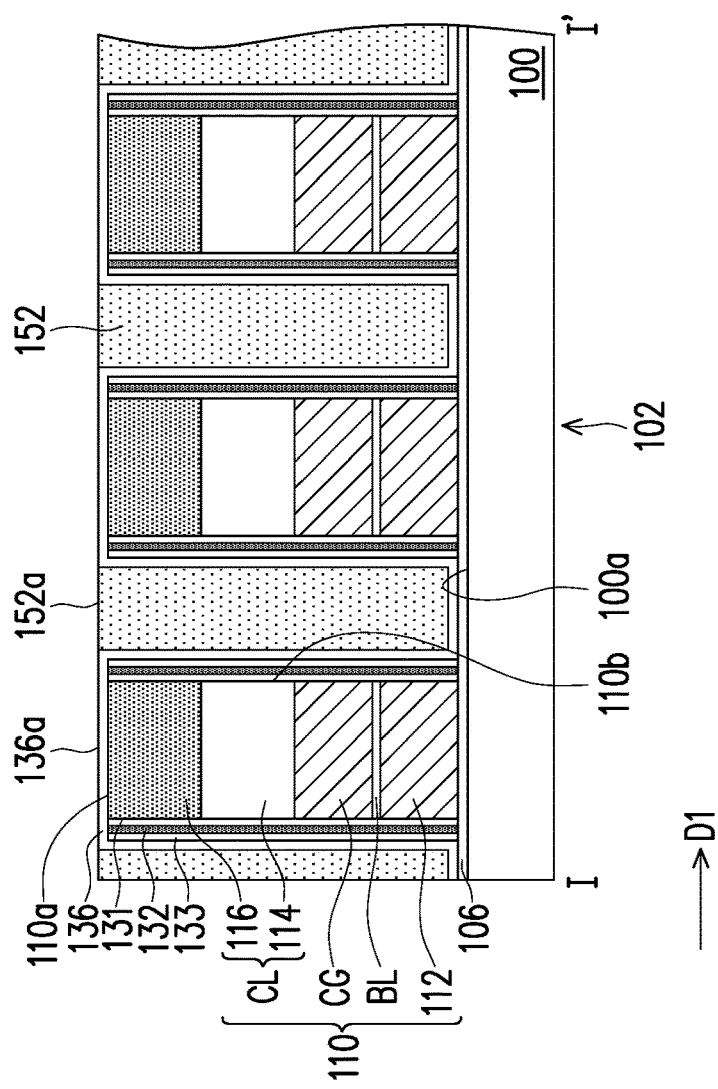

Next, referring to FIGS. 10A and 10B together, the hard mask layer 116 serves as a polishing buffer layer. A planarization process is performed on the conductor layer 138 until an uppermost top surface 136a of the protective layer 136 is exposed to obtain conductor strips 152. In the embodiment, each conductor strip 152 is located between the two adjacent first stack structures 110. The surface of the substrate 100 serves as the reference plane. A horizontal height of the uppermost top surface 136a of the protective layer 136 is substantially equal to a horizontal height of top surfaces 152a of the conductor strips 152. In other words, the uppermost top surface 136a of the protective layer 136 and the top surfaces 152a of the conductor strips 152 are substantially coplanar. In contrast, in a conventional technology, a conductor layer with a certain height kept in advance is adopted. The height is, for example, greater than the height of the first stack structures, and a spin-on carbon layer or a photoresist layer is formed on the conductor layer. Then, a patterning process is performed on the conductor layer to obtain multiple conductor strips. However, in the embodiment, the hard mask layer 116 of the first stack structures 110 serves as the polishing buffer layer so that an area in which a source contact plug is further formed may be also isolated directly through the planarization process when the conductor strips 152 are formed (i.e. a dummy source contact plug is formed). Hence, the patterning process may be only further performed on at least one of the multiple conductor strips 152 to form a conductor pillar (i.e. a dummy drain contact plug is formed). Relevant details are described below. In an embodiment, the planarization process is, for example, a chemical mechanical polishing (CMP) process, an etching back process, or the combination thereof.

In addition, in a process of forming the conductor strips 152, the planarization process may be performed on the oxide layer 150 at the same time to reduce the horizontal height of the top surface 150a of the oxide layer 150. In the embodiment, the surface of the substrate 100 serves as the reference plane. The horizontal height of the top surface 150a of the oxide layer 150 is substantially equal to a horizontal height of the top surfaces 152a of the conductor strips 152. In other words, the top surface 150a of the oxide layer 150 and the top surfaces 152a of the conductor strips 152 are substantially coplanar.

Next, referring to FIGS. 11A to 11E, a mask pattern PR is formed on the substrate 100. The mask pattern PR has multiple first openings OP1 corresponding to the conductor strips 152 of a side of the first stack structures 110. That is, the first openings OP1 are located directly above the conductor strips 152 of the side of the first stack structures 110 but not located directly above the conductor strips 152 of the other side of the first stack structures 110. In addition, it may be obtained from FIGS. 11A, 11C, and 11D that the first openings OP1 are located directly above the conductor strips 152 on the isolation structures 101 but not located directly above the conductor strips 152 on the active areas AA. As shown in FIGS. 11A and 11C, a width W of the first openings OP1 in the second direction D2 is, for example, 120 nm, and a portion of the protective layer 136 and the corresponding conductor strips 152 are exposed. In an embodiment, a material of the mask pattern PR is, for example, a suitable material, such as carbon or a photoresist material.

Next, referring to FIGS. 12A to 12E, the conductor strips 152 are patterned into multiple conductor pillars 154. Specifically, with the mask pattern PR as a mask, the conductor strips 152 exposed by the first openings OP1 are removed to form the multiple conductor pillars 154 and second openings OP2. The protective layer 136 on the surface 100a of the substrate 100 is exposed by the second openings OP2. In addition, as shown in FIG. 12C, multiple conductor pillars 154 are respectively disposed on the active areas AA and alternately disposed along the second direction D2. Specifically, FIG. 12A is a schematic cross-sectional diagram of FIG. 12C along the line I-I'. After the patterning process above is performed, the conductor strips 152 in FIG. 12A are removed. In addition, FIG. 12D is a schematic cross-sectional diagram of FIG. 12C along the line II-II'. After the patterning process above is performed, the conductor strips 152 in FIG. 12D are not removed so that the conductor pillars 154 are formed. In an embodiment, a method of removing the conductor strips 152 may be a dry etching process, such as a reactive ion etching process; however, the disclosure is not limited thereto.

In the embodiment, as shown in FIGS. 12A, 12C, and 12D, the conductor strips 152 may be viewed as dummy source contact plugs, and the conductor pillars 154 may be viewed as dummy drain contact plugs. Here, the term "dummy" refers to a structure removed in a further replacement process. Locations of the dummy source/drain contact plugs may be replaced with source/drain contact plugs formed in a further process.

Next, referring to FIGS. 13A to 13D, FIGS. 14A to 14D, FIGS. 15A to 15D, FIGS. 16A to 16D, and FIGS. 17A to 17D, the replacement process is performed to replace the conductor strips 152 and the conductor pillars 154 with multiple contact plugs 162 and contact plugs 164. Specifically, referring to FIGS. 13A to 13D, a nitride layer 156 and an oxide layer 158 may be sequentially formed on the substrate 100. The nitride layer 156 conformally covers the substrate 100. The oxide layer 158 is filled in the second openings OP2 and blanketly covers the nitride layer 156. In an embodiment, the nitride layer 156 may be silicon nitride, and the oxide layer 158 may be silicon dioxide.

Next, referring to FIGS. 14A to 14D, the planarization process is performed on the oxide layer 158 to expose the nitride layer 156 not located on the second openings OP2. In this way, an uppermost top surface 156a of the nitride layer 156 and a top surface 160a of an oxide layer 160 may be viewed as coplanar. In an embodiment, the planarization process is, for example, a chemical mechanical polishing process, an etching back process, or the combination thereof.

Referring to FIGS. 15A to 15D, a portion of the nitride layer 156, the conductor strips 152 and the conductor pillars 154 are removed to form multiple third openings OP3 and fourth openings OP4. The multiple third openings OP3 and the multiple fourth openings OP4 are respectively formed between the first stack structures 110 to expose the protective layer 136. Here, the first stack structures 110 of the embodiment have the flat and smooth sidewalls 110b and do not have the protruding portion. Hence, when the conductor strips 152 and the conductor pillars 154 are removed, damage to the protective layer 136 on the sidewalls 110b of the first stack structures 110 may be prevented to avoid element current leakage so that the reliability of a semiconductor memory device may be enhanced. In the embodiment, the third openings OP3 may be openings in a shape of a strip and extend along the second direction D2. The fourth openings OP4 may be openings in a shape of an island or a column and alternately disposed along the second direction D2. In an embodiment, a method of removing the portion of the nitride layer 156, the conductor strips 152, and the conductor pillars 154 may be, for example, a dry etching process in which etching is performed with different etching gas, such as a reactive ion etching process.

Next, referring to FIGS. 16A to 16D, an etching process is performed to remove the protective layer 136 and the tunneling dielectric layer 106 below the third openings OP3 and fourth openings OP4 so that the third openings OP3 and fourth openings OP4 extend downwards to expose the substrate 100. In the etching process, the protective layer 136 on the top surfaces 110a of the first stack structures 110 is also removed so that the top surfaces 110a of the first stack structures 110 and the adjacent top surface 160a of the oxide layer 160 are coplanar. In an embodiment, the etching process may include a dry etching process, such as a reactive ion etching process. In the embodiment, the hard mask layer 116 may further protect the first stack structures 110 from being damaged in the etching process.

Next, referring to FIGS. 17A to 17D, a conductor material is formed in the third openings OP3 and the fourth openings OP4 to form the multiple contact plugs 162, the multiple contact plugs 164 to complete a memory device 10 of the embodiment. In the embodiment, the contact plugs 162 may be viewed as the source contact plugs, and the contact plugs 164 may be viewed as the drain contact plugs. In an embodiment, in a direction of a top view of the memory device 10, the contact plugs 162 may be in a shape of a strip and extend along the second direction D2. In another embodiment, in the direction of the top view of the memory device 10, the contact plugs 164 may be in a shape of an island and alternately disposed along the second direction D2. In an embodiment, the memory device 10 is, for example, a flash memory device; however, the disclosure is not limited thereto. In an embodiment, the conductor material includes a metal material (e.g. W, Cu, AlCu, and the like), barrier metal (e.g. Ti, TiN, Ta, TaN, and the like), or the combination thereof. A method of forming the conductor material may be a suitable method, such as electroplating, physical vapor deposition (PVD), chemical vapor deposition (CVD), and the like.

A memory device of the embodiment is described below through FIGS. 17A to 17D. Note that the memory device of the embodiment is manufactured, for example, through the manufacturing method above; however, the manufacturing method of the memory device of the embodiment is not limited thereto.

Referring to FIGS. 17A to 17D, the memory device 10 of the embodiment includes the substrate 100, the multiple first stack structures 110, the multiple second stack structures 120, the protective layer 136, and the multiple contact plugs 162 and 164. The protective layer 136 covers the sidewalls 110b of the first stack structures 110. The multiple first stack structures 110 are arranged along the first direction D1 on the substrate 100 of the array area 102, and each of the first stack structures 110 extends along the second direction D2. As shown in the schematic cross-sectional diagrams FIGS. 17A and 17C, each of the first stack structure 110 includes, in sequence from the substrate 100, the charge storage structure 112, the barrier layer BL, the control gate CG, and the cap layer CL. Specifically, the width in the first direction D1 of the charge storage structure 112, the width in the first direction D1 of the control gate CG, and the width in the first direction D1 of the cap layer CL are substantially equal to each other. That is, the first stack structures 110 have the substantially flat and smooth sidewalls 110b so that the protective layer 136 may be prevented from damage, such as the etching process, and completeness of the protective layer 136 may be maintained to further increase the reliability of the device.

In the embodiment, the cap layer CL may be, for example, the multilayer structure including the dielectric layer 114 and the hard mask layer 116. The dielectric layer 114 is disposed between the control gate CG and the hard mask layer 116. The width in the first direction D1 of the dielectric layer 114 is substantially equal to the width in the first direction D1 of the hard mask layer 116. In this way, flat and smooth surfaces of the first stack structures 110 may be maintained, and the completeness of the protective layer 136 on the sidewalls 110b is ensured.

As shown in FIGS. 17A to 17D, the multiple contact plugs 162 and the multiple contact plugs 164 are respectively disposed on the substrate 100 among the multiple first stack structures 110. In the embodiment, the contact plugs 162 may be viewed as the source contact plugs, and the contact plugs 164 may be viewed as the drain contact plugs. In an embodiment, in the direction of the top view of the memory device 10, the contact plugs 162 may be in a shape of a strip and extend along the second direction D2. In another embodiment, in the direction of the top view of the memory device 10, the contact plugs 164 may be in a shape of an island and alternately disposed along the second direction D2. In the embodiment, top surfaces 162a of the contact plugs 162, top surfaces 164a of the contact plugs 164, and the top surfaces 110a of the first stack structures 110 are substantially coplanar.

In summary of the above, in the disclosure, the width in the first direction of the charge storage structure, the width in the first direction of the control gate, and the width in the first direction of the cap layer are substantially equal to each other so that the first stack structures have the sidewalls that are substantially flat and smooth. In this way, the protective layer may be prevented from damage, such as the etching process, and the completeness of the protective layer may be maintained to further increase the reliability of the device. In addition, in the manufacturing method of the disclosure, the hard mask layer of the first stack structures may serve as polishing buffer layer. Hence, dummy source contact plugs may be directly isolated through the planarization process, and the patterning process may be simply further performed to form dummy drain contact plugs.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A memory device, comprising:
    a plurality of stack structures arranged along a first direction on an array area of a substrate, wherein each of the stack structures extends along a second direction different from the first direction, in a cross-sectional view of the memory device, each of the stack structures comprises, in sequence from the substrate, a charge storage structure, a control gate, and a cap layer, and the cap layer has a multilayer structure;
    a protective layer covering sidewalls of the stack structures,
    wherein a width in the first direction of the charge storage structure, a width in the first direction of the control gate, and a width in the first direction of the cap layer are substantially equal to each other, and
    a plurality of contact plugs respectively disposed on the substrate among the plurality of stack structures, wherein heights of the contact plugs relative to the substrate and heights of the stack structures relative to the substrate are substantially the same.

2. The memory device according to claim 1, wherein the cap layer comprises a dielectric layer and a hard mask layer, the dielectric layer is disposed between the control gate and the hard mask layer, and a width in the first direction of the dielectric layer is substantially equal to a width in the first direction of the hard mask layer.

3. The memory device according to claim 2, wherein a material of the hard mask layer is silicon nitride.

4. The memory device according to claim 2, wherein a thickness of the hard mask layer is 100 nm to 150 nm.

5. The memory device according to claim 2, wherein a material of the dielectric layer is silicon dioxide.

6. The memory device according to claim 1, wherein the plurality of contact plugs comprise:
    a plurality of source contact plugs, wherein, in a direction of a top view of the memory device, the source contact plugs are in a shape of a strip and extend along the second direction; and
    a plurality of drain contact plugs, wherein, in the direction of the top view of the memory device, the drain contact plugs are in a shape of an island and disposed alternately along the second direction.

7. The memory device according to claim 1, wherein the charge storage structure is a floating gate.

8. The memory device according to claim 1, wherein a material of the protective layer is silicon nitride.

9. The memory device according to claim 1, further comprising:
    a spacer layer disposed between the protective layer and the sidewalls of the stack structures.

10. A method of manufacturing a memory device, the method comprising:
    forming a plurality of stack structures on a substrate of an array area, wherein the stack structures are arranged along a first direction, and each of the stack structures extends along a second direction different from the first direction, in a cross-sectional view of the memory device, each of the stack structures comprises, in sequence from the substrate, a charge storage structure, a control gate, and a cap layer, and the cap layer has a multilayer structure, wherein a width in the first direction of the charge storage structure, a width in the first direction of the control gate, and a width in the first direction of the cap layer are substantially equal to each other;
    forming a protective layer on sidewalls of the stack structures;
    forming a conductor layer on the substrate to fill space among the plurality of stack structures;
    performing a planarization process to form a plurality of conductor strips;
    patterning at least one of the conductor strips to form a plurality of conductor pillars; and
    performing a replacement process to replace the plurality of conductor strips and the plurality of conductor pillars with a plurality of contact plugs, wherein heights of the contact plugs relative to the substrate and heights of the stack structures relative to the substrate are substantially the same.

11. The method of manufacturing the memory device according to claim 10, wherein the cap layer comprises a dielectric layer and a hard mask layer, the dielectric layer is disposed between the control gate and the hard mask layer, and a width in the first direction of the dielectric layer is substantially equal to a width in the first direction of the hard mask layer.

12. The method of manufacturing the memory device according to claim 11, wherein a material of the hard mask layer is silicon nitride.

13. The method of manufacturing the memory device according to claim 11, wherein a thickness of the hard mask layer is 100 nm to 150 nm.

14. The method of manufacturing the memory device according to claim 11, wherein a material of the dielectric layer is silicon dioxide.

15. The method of manufacturing the memory device according to claim 10, wherein the replacement process comprises:

removing the plurality of conductor strips and the plurality of conductor pillars to respectively form a plurality of openings among the plurality of stack structures, wherein the plurality of openings expose the substrate; and filling a conductor material in the plurality of openings to form the plurality of contact plugs.

16. The method of manufacturing the memory device according to claim 10, wherein the charge storage structure is a floating gate.

17. The method of manufacturing the memory device according to claim 10, wherein a material of the protective layer is silicon nitride.

18. The method of manufacturing the memory device according to claim 10, wherein the planarization process is a chemical mechanical polishing (CMP) process, an etching back process, or the combination thereof.

* * * * *